United States Patent
Saito et al.

(10) Patent No.: US 9,240,542 B2
(45) Date of Patent: Jan. 19, 2016

(54) PIEZOELECTRIC CERAMIC, PIEZOELECTRIC ELEMENT, ULTRASONIC MOTOR, AND DUST REMOVING DEVICE

(71) Applicant: CANON KABUSHIKI KAISHA, Tokyo (JP)

(72) Inventors: Hiroshi Saito, Kawasaki (JP); Kanako Oshima, Tokyo (JP); Kaoru Miura, Matsudo (JP); Hisato Yabuta, Machida (JP); Jumpei Hayashi, Chofu (JP)

(73) Assignee: Canon Kabushiki Kiasha, Tokyo (JP)

( * ) Notice: Subject to any disclaimer, the term of this patent is extended or adjusted under 35 U.S.C. 154(b) by 185 days.

(21) Appl. No.: 13/868,428

(22) Filed: Apr. 23, 2013

(65) Prior Publication Data

US 2013/0278681 A1 Oct. 24, 2013

(30) Foreign Application Priority Data

Apr. 24, 2012 (JP) ................................ 2012-098679

(51) Int. Cl.
*H01L 41/47* (2013.01)
*H01L 41/187* (2006.01)
*H01L 41/43* (2013.01)
*H01L 41/083* (2006.01)
(Continued)

(52) U.S. Cl.
CPC ............. *H01L 41/1871* (2013.01); *B41J 2/045* (2013.01); *G02B 27/0006* (2013.01); *H01L 41/0477* (2013.01); *H01L 41/083* (2013.01); *H01L 41/0973* (2013.01); *H01L 41/273* (2013.01); *H01L 41/43* (2013.01); *H02N 2/001* (2013.01); *H02N 2/106* (2013.01); *H02N 2/163* (2013.01); *H04R 17/00* (2013.01); *Y10T 29/42* (2015.01)

(58) Field of Classification Search
CPC ............. H01L 41/0477; H01L 41/083; H01L 41/1871; H01L 41/43; H01L 41/273; H01L 41/093; H02N 2/001; H02N 2/106; H02N 2/163; H04R 17/00; Y10T 29/42; B41J 2/045

USPC ............ 310/363, 311, 323.02, 366, 322, 328, 310/365; 252/62.9 PZ; 29/25.35; 347/68; 501/137

IPC ........ H01L 41/047,41/083, 41/187, 41/43; B41J 2/045

See application file for complete search history.

(56) References Cited

U.S. PATENT DOCUMENTS 8,547,001 B2 * 10/2013 Saito et al. ..................... 310/358
8,714,712 B2 * 5/2014 Hamada ........................ 310/311

FOREIGN PATENT DOCUMENTS

JP          4039029 B2     1/2008
JP          2010-120835 A  6/2010

*Primary Examiner* — Thomas Dougherty
*Assistant Examiner* — Karen B Addison
(74) *Attorney, Agent, or Firm* — Canon U.S.A. Inc., IP Division

(57) ABSTRACT

There is provided a piezoelectric ceramic having a high and stable piezoelectric constant and a high and stable mechanical quality factor in a wide operating temperature range, and a piezoelectric element according to the present invention includes a main component containing a perovskite type metal oxide having the following general formula (1) or (2); and Mn as a first auxiliary component,

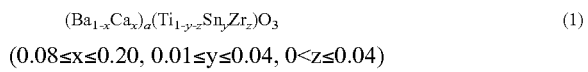

$(0.08 \leq x \leq 0.20, 0.01 \leq y \leq 0.04, 0 < z \leq 0.04)$

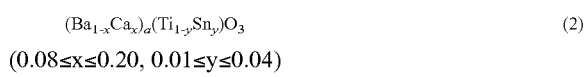

$(0.08 \leq x \leq 0.20, 0.01 \leq y \leq 0.04)$ wherein the amount b (mol) of Mn per mole of the metal oxide is in the range of $0.0048 \leq b \leq 0.0400$, and the value a of the general formula (1) or (2) is in the range of $0.9925+b \leq a \leq 1.0025+b$.

19 Claims, 18 Drawing Sheets

(51) Int. Cl.
*H01L 41/047* (2006.01)
*B41J 2/045* (2006.01)
*H02N 2/00* (2006.01)
*G02B 27/00* (2006.01)
*H04R 17/00* (2006.01)
*H01L 41/09* (2006.01)
*H01L 41/273* (2013.01)
*H02N 2/10* (2006.01)
*H02N 2/16* (2006.01)

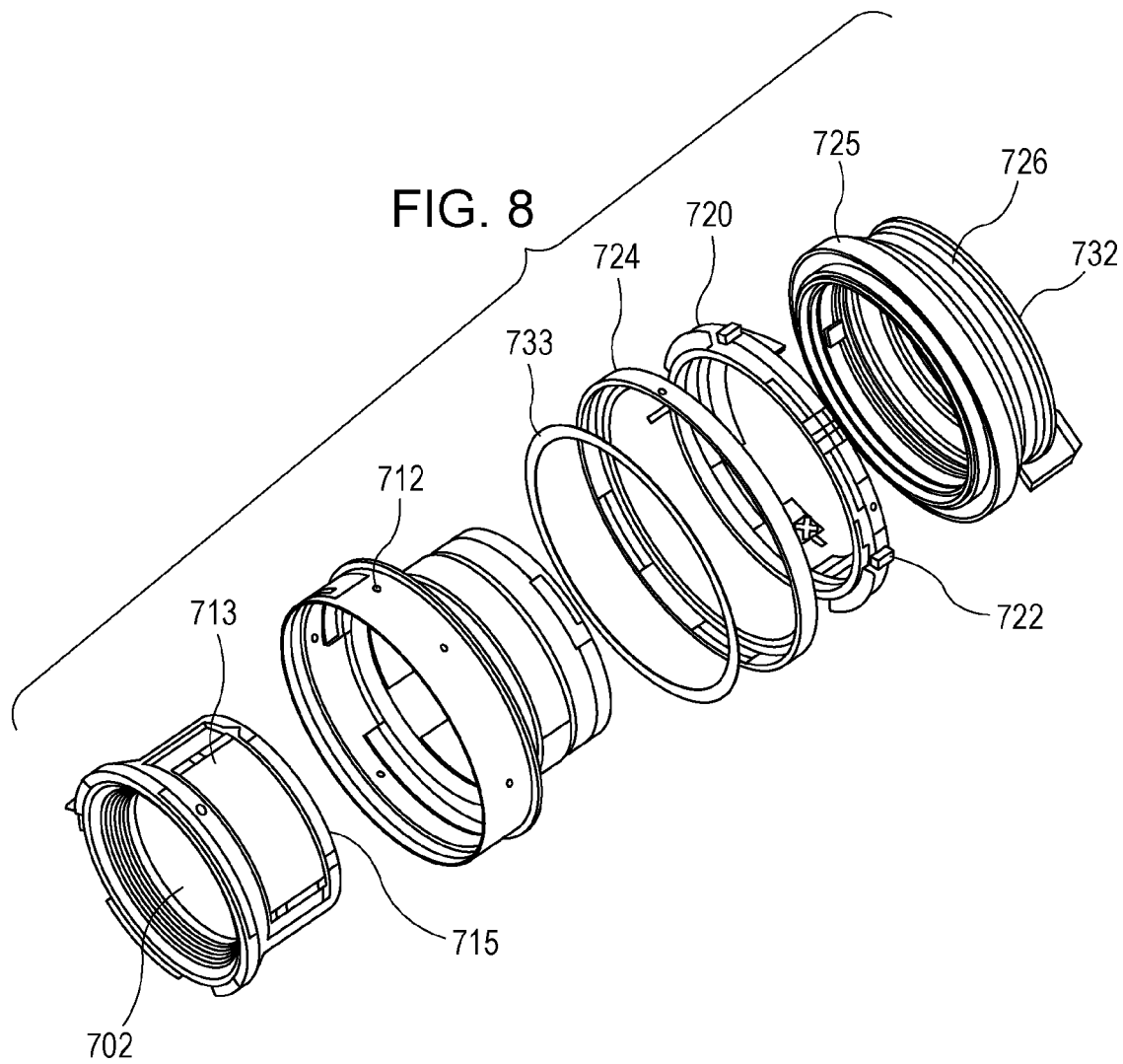

PIEZOELECTRIC CERAMIC, PIEZOELECTRIC ELEMENT, ULTRASONIC MOTOR, AND DUST REMOVING DEVICE

BACKGROUND OF THE INVENTION

1. Field of the Invention

The present invention relates to a piezoelectric ceramic and more particularly to a lead-free piezoelectric ceramic and a method for manufacturing the lead-free piezoelectric ceramic. The present invention also relates to a piezoelectric element, a multilayered piezoelectric element, a method for manufacturing a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric ceramic.

2. Description of the Related Art

In general, piezoelectric ceramics are $ABO_3$ perovskite type metal oxides, such as lead zirconate titanate (hereinafter referred to as "PZT"). However, PZT contains lead as an A site element, and its effect on the environment is regarded as a problem. Thus, there is a demand for piezoelectric ceramics of lead-free perovskite type metal oxides.

One known piezoelectric ceramic of a lead-free perovskite type metal oxide is barium titanate. In order to improve the characteristics of barium titanate, materials based on barium titanate are being developed.

Japanese Patent No. 4039029 discloses a piezoelectric ceramic containing barium titanate, wherein the A site of the barium titanate is partly substituted by Ca. Japanese Patent Laid-Open No. 2010-120835 discloses a material containing the piezoelectric ceramic and Mn, Fe, or Cu, wherein the A site of the barium titanate is partly substituted by Ca. These materials have a higher mechanical quality factor than barium titanate but disadvantageously have a poor piezoelectric property.

SUMMARY OF THE INVENTION

The present invention addresses these problems and provides a lead-free piezoelectric ceramic having a high and stable piezoelectric constant and a high and stable mechanical quality factor in a wide operating temperature range and a method for manufacturing the lead-free piezoelectric ceramic.

The present invention also provides a piezoelectric element, a multilayered piezoelectric element, a method for manufacturing a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric ceramic.

A piezoelectric ceramic according to one aspect of the present invention contains a main component containing a perovskite type metal oxide having the following general formula (1) or (2); and Mn as a first auxiliary component. The amount b (mol) of Mn per mole of the metal oxide is in the range of $0.0048 \leq b \leq 0.0400$, and the value a of the general formula (1) or (2) is in the range of $0.9925+b \leq a \leq 1.0025+b$.

$$(Ba_{1-x}Ca_x)_a(Ti_{1-y-z}Sn_yZr_z)O_3 \quad (1)$$

$(0.08 \leq x \leq 0.20, 0.01 \leq y \leq 0.04, 0 \leq z \leq 0.04)$

$$(Ba_{1-x}Ca_x)_a(Ti_{1-y-z}Sn_y)O_3 \quad (2)$$

$(0.08 \leq x \leq 0.20, 0.01 \leq y \leq 0.04)$

The present invention can provide a lead-free piezoelectric ceramic having a high and stable piezoelectric constant and a high and stable mechanical quality factor in a wide operating temperature range.

Further features of the present invention will become apparent from the following description of exemplary embodiments with reference to the attached drawings.

BRIEF DESCRIPTION OF THE DRAWINGS

FIG. 8 is a schematic view of an optical apparatus according to an embodiment of the present invention.

FIGS. 15A to 15C correspond to z=0, 0.03, and 0.04, respectively. FIG. 15D corresponds to z=0.01.

DESCRIPTION OF THE EMBODIMENTS

Figure 1:
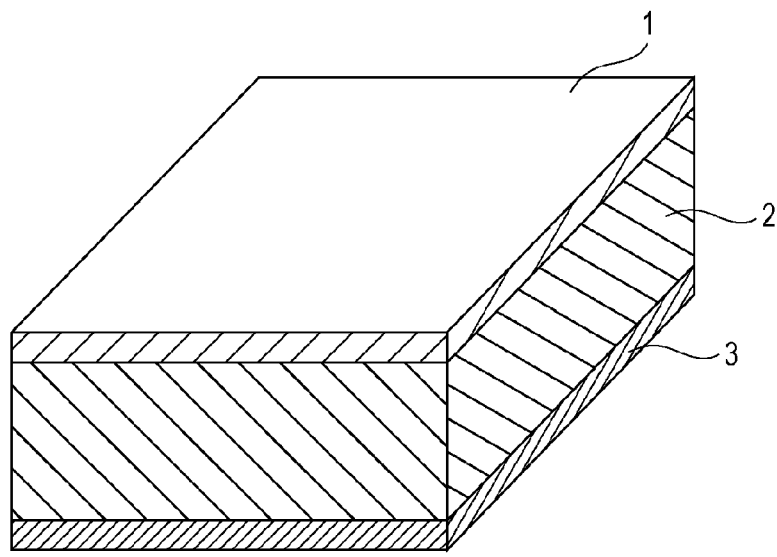
FIG. 1 is a schematic view of a piezoelectric element according to an embodiment of the present invention.

Embodiments of the present invention will be described below.

A piezoelectric ceramic according to an embodiment of the present invention contains a main component containing a perovskite type metal oxide having the following general formula (1) or (2) and Mn as a first auxiliary component. The amount b (mol) of Mn per mole of the metal oxide is in the range of 0.0048≤b≤0.0400, and the value a of the general formula (1) or (2) is in the range of 0.9925+b≤a≤1.0025+b.

(0.08≤x≤0.20, 0.01≤y≤0.04, 0≤z≤0.04)

(0.08≤x≤0.20, 0.01≤y≤0.04)

Perovskite Type Metal Oxide

The term "perovskite type metal oxide", as used herein, refers to a metal oxide having a perovskite structure, which is ideally a cubic structure, as described in Iwanami Rikagaku Jiten, 5th edition (Iwanami Shoten, published on Feb. 20, 1998). A metal oxide having a perovskite structure is generally represented by the chemical formula $ABO_3$. In a perovskite type metal oxide, elements A and B in the form of ions occupy particular positions of a unit cell referred to as the A site and the B site, respectively. For a cubic unit cell, the element A occupies the vertexes of the cube, and the element B occupies the body-centered position of the cube. The element O as an oxygen anion occupies the face-centered positions of the cube.

In the metal oxide having the general formula (1), the metallic elements at the A site are Ba and Ca, and the metallic elements at the B site are Ti, Zr, and Sn. Part of Ba and Ca may occupy the B site. Likewise, part of Ti and Zr may occupy the A site. However, Sn should not occupy the A site because this impairs the piezoelectric property.

In the general formula (1), although the molar ratio of the B site element to the element O is 1:3, small variations in the molar ratio (for example, 1.00:2.94 to 1.00:3.06) are within the scope of the present invention, provided that the metal oxide has the perovskite structure as the primary phase.

The perovskite structure of the metal oxide can be determined by structural analysis using X-ray diffraction or electron diffraction.

Ceramic

The term "ceramic", as used herein, refers to an aggregate of crystal grains (also referred to as a bulk), that is, a polycrystalline material, containing a metal oxide as the base component and sintered by heat treatment. The term "ceramic" also includes a ceramic processed after sintering.

Main Component of Piezoelectric Ceramic According to Embodiment of Present Invention In a piezoelectric ceramic according to an embodiment of the present invention, the value a of the general formula (1), which represents the ratio of the number of moles of Ba and Ca at the A site to the number of moles of Ti, Zr, and Sn at the B site, is in the range of 0.9925+b≤a≤1.0025+b. The value b denotes the amount (mol) of first auxiliary component Mn per mole of the metal oxide. When the value a is smaller than 0.9925+b, this tends to result in abnormal grain growth in the piezoelectric ceramic and a decrease in the mechanical strength of the metal oxide. When the value a is larger than 1.0025+b, this results in an excessively high grain growth temperature, making sintering of the metal oxide impossible in common furnaces. The phrase "making sintering of the metal oxide impossible" means that the piezoelectric ceramic has a low density or contains many pores and defects. Most of the first auxiliary component Mn occupies the B site. An increase in the value b representing the amount of Mn results in an increase in the number of B sites, which requires a corresponding increase in the value a.

The value x of the general formula (1), which represents the molar ratio of Ca at the A site, is in the range of 0.08≤x≤0.20, preferably 0.09≤x≤0.18. A value x of less than 0.08 results in structural phase transition at an operating temperature, thereby adversely affecting the durability of the piezoelectric ceramic in operation. A value x of more than 0.20 results in a deterioration in piezoelectric property.

The value y of the general formula (1), which represents the molar ratio of Sn at the B site, is in the range of 0.01≤y≤0.04, preferably 0.015≤y≤0.035. A value y of less than 0.01 results in a deterioration in piezoelectric property. A value y of more than 0.04 results in a low Curie temperature (TC) of less than 100° C. and a deterioration in piezoelectric property at high temperature.

The value z of the general formula (1), which represents the molar ratio of Zr at the B site, is in the range of 0≤z≤0.04. A value z of more than 0.04 undesirably results in high sintering temperature.

The value z of the general formula (1), which represents the molar ratio of Zr at the B site, may be zero. A value z of zero results in a high grain growth rate during sintering. This can advantageously reduce the sintering temperature. A piezoelectric ceramic according to an embodiment of the present invention may contain Zr inevitably contained in a commercially available raw material for Ti.

The composition of a piezoelectric ceramic according to an embodiment of the present invention may be determined by any method. The method may be X-ray fluorescence spectroscopy, ICP spectroscopy, or atomic absorption spectrometry. The weight ratio and the molar ratio of the elements of the piezoelectric ceramic can be determined by using any of these methods.

First Auxiliary Component of Piezoelectric Ceramic According to Embodiment of Present Invention The first auxiliary component is Mn. The amount b (mol) of Mn per mole of the metal oxide is in the range of 0.0048≤b≤0.0400. piezoelectric ceramic according to an embodiment of the present invention containing the amount of Mn in this range has an improved mechanical quality factor without reduction in the piezoelectric constant. The term "mechanical quality factor" refers to a coefficient that represents elastic loss resulting from vibration in the evaluation of a piezoelectric ceramic as an oscillator. The mechanical quality factor is observed as the sharpness of a resonance curve in impedance measurement. Thus, the mechanical quality factor is a coefficient that represents the sharpness of resonance of an oscillator. An improvement in insulation property or mechanical quality factor ensures long-term reliability of the piezoelectric ceramic when the piezoelectric ceramic is driven as a piezoelectric element by the application of a voltage.

A value b of less than 0.0048 results in a low mechanical quality factor of less than 400. A low mechanical quality factor disadvantageously results in an increase in the power consumption of a resonance device that includes a piezoelectric element composed of the piezoelectric ceramic and a pair of electrodes. The mechanical quality factor is preferably 400 or more, more preferably 600 or more. In this range, no excessive increase in power consumption occurs in practical operation. A value b of more than 0.0400 unfavorably results in a deterioration in piezoelectric property or the occurrence of hexagonal crystals, which do not contribute to the piezoelectric property.

Mn can occupy the B site.

Mn can have a valence of 4+. In general, Mn can have a valence of 4+, 2+, or 3+. In the presence of conduction electrons in crystals (for example, in the presence of oxygen vacancies in crystals or in the presence of donor elements occupying the A site), Mn having a valence of 4+ can trap the conduction electrons and improve insulation resistance by reducing its valence to 3+ or 2+. In terms of the ionic radius, Mn having a valence of 4+ can easily substitute for the main component Ti of the B site.

Mn having a valence of less than 4+, such as 2+, acts as an acceptor. The presence of Mn as an acceptor in perovskite crystals results in the formation of holes or oxygen vacancies in the crystals.

In the presence of a large amount of Mn having a valence of 2+ or 3+, holes cannot be compensated for with oxygen vacancies alone, and the insulation resistance decreases. Thus, Mn can mostly have a valence of 4+. A minor proportion of Mn may have a valence of less than 4+ and occupy the B site of the perovskite structure as an acceptor or form oxygen vacancies. Mn having a valence of 2+ or 3+ and oxygen vacancies can form defect dipoles and thereby improve the mechanical quality factor of a piezoelectric material.

A piezoelectric ceramic according to an embodiment of the present invention can further contain a second auxiliary component containing at least one selected from the group consisting of Cu, B, and Si, wherein the second auxiliary component content on a metal basis is 0.001 parts by weight or more and 4.000 parts by weight or less, preferably 0.003 parts by weight or more and 2.000 parts by weight or less, per 100 parts by weight of the metal oxide.

The second auxiliary component content is a weight ratio of the second auxiliary component to 100 parts by weight of the constituent elements of the metal oxide having the general formula (1) on an oxide basis, which is calculated from the amounts of Ba, Ca, Ti, Sn, Zr, Mn, and metals of the second auxiliary component of the piezoelectric ceramic measured, for example, by X-ray fluorescence spectroscopy (XRF), ICP spectroscopy, or atomic absorption spectrometry.

Second Auxiliary Component of Piezoelectric Ceramic according to Embodiment of Present Invention The second auxiliary component is at least one of Cu, B, and Si. B and Si can segregate at interfaces between crystal grains of the piezoelectric ceramic. This reduces a leakage current flowing through the interfaces between crystal grains and increases insulation resistance. Cu can dissolve in crystal grains and increase insulation resistance. At least 0.001 parts by weight of the second auxiliary component in the piezoelectric ceramic can increase insulation resistance. Less than 0.001 parts by weight of the second auxiliary component undesirably results in reduced insulation resistance. More than 4.000 parts by weight of the second auxiliary component in the piezoelectric ceramic undesirably results in a reduced dielectric constant and a deterioration in piezoelectric property. The weight ratio G1/G2 of the weight G1 of Si to the weight G2 of B may be in the range of $2.0 \leq G1/G2 \leq 3.8$. This range results in particularly suitable insulation resistance. The Si content may be 0.003 parts by weight or more and 1.000 parts by weight or less. The Cu content may be 0.100 parts by weight or more and 2.000 parts by weight or less. The B content may be 0.001 parts by weight or more and 1.000 parts by weight or less.

A multilayered piezoelectric element has a thin piezoelectric ceramic layer between electrodes and therefore requires durability in a high electric field. Because of its particularly high insulation resistance, a piezoelectric ceramic according to an embodiment of the present invention is suitable for a multilayered piezoelectric element.

A piezoelectric ceramic according to an embodiment of the present invention may contain the metal oxide having the general formula (1) and a third auxiliary component other than the first auxiliary component and the second auxiliary component, provided that the third auxiliary component does not adversely affect the characteristics of the piezoelectric ceramic. The amount of the third auxiliary component may be 1.2 parts by weight or less per 100 parts by weight of the metal oxide having the general formula (1). More than 1.2 parts by weight of the third auxiliary component may result in a deterioration in the piezoelectric property or the insulation property of the piezoelectric ceramic. The metallic element content of the third auxiliary component except Ba, Ca, Ti, Zr, Sn, Mn, Cu, B, and Si may be 1.0 part by weight or less on an oxide basis or 0.9 parts by weight or less on a metal basis per 100 parts by weight of the piezoelectric ceramic. The term "metallic element", as used herein, includes metalloid elements such as Ge and Sb. When the metallic element content of the third auxiliary component except Ba, Ca, Ti, Zr, Sn, Mn, Cu, B, and Si is more than 1.0 part by weight on an oxide basis or more than 0.9 parts by weight on a metal basis per 100 parts by weight of the piezoelectric ceramic, this may result in a marked deterioration in the piezoelectric property or the insulation property of the piezoelectric ceramic. The total amount of Li, Na, Al, Zn, Sr, and K of the third auxiliary component may be 0.5 parts by weight or less on a metal basis per 100 parts by weight of the piezoelectric ceramic. When the total amount of Li, Na, Al, Zn, Sr, and K of the third auxiliary component is more than 0.5 parts by weight on a metal basis per 100 parts by weight of the piezoelectric ceramic, this may result in insufficient sintering. The total amount of Y and V of the third auxiliary component may be 0.2 parts by weight or less on a metal basis per 100 parts by weight of the piezoelectric ceramic. When the total amount of Y and V of the third auxiliary component is more than 0.2 parts by weight on a metal basis per 100 parts by weight of the piezoelectric ceramic, this may make polarization treatment difficult.

A piezoelectric ceramic according to an embodiment of the present invention may contain Nb inevitably contained in a commercially available raw material for Ti and Hf inevitably contained in a commercially available raw material for Zr.

The main component having the general formula (1), the first auxiliary component, and the second auxiliary component can constitute 98.5% by mole or more of a piezoelectric ceramic according to an embodiment of the present invention. The perovskite type metal oxide having the general formula (1) preferably constitutes 90% by mole or more, more preferably 95% by mole or more, of the piezoelectric ceramic.

The parts by weight of the first auxiliary component, the second auxiliary component, and the third auxiliary component may be measured by any method, including X-ray fluorescence spectroscopy, ICP spectroscopy, and atomic absorption spectrometry.

Phase Transition Point

A piezoelectric ceramic according to an embodiment of the present invention preferably has no structural phase transition point at a temperature in the range of 0° C. to 90° C., more preferably −20° C. to 100° C.

Generally known barium titanate has an orthorhombic-to-tetragonal transition temperature (hereinafter referred to as $T_{o \to t}$) of approximately 17° C. and a tetragonal-to-orthorhombic transition temperature ($T_{t \to o}$) of approximately 5° C. While repeatedly passing through these structural phase transition points, the piezoelectric ceramic may gradually become depolarized because of variations in the unit cell volume and polarization axial direction, resulting in a deterioration in piezoelectric property. Thus, barium titanate is difficult to use in a wide temperature range. A piezoelectric ceramic according to an embodiment of the present invention has $T_{o \to t}$ of less than 0° C. and is unlikely to cause the problem of barium titanate. A piezoelectric ceramic according to an embodiment of the present invention has a Curie temperature of 90° C. or more and can maintain its piezoelectricity even at an excessively high temperature of 80° C. as in a car in summer. A piezoelectric ceramic according to an embodiment of the present invention can maintain a tetragonal structure at a temperature in the range of 0° C. to 90° C., maintain a high mechanical quality factor, and avoid an orthorhombic crystal region in which the mechanical quality factor decreases. Thus, the piezoelectric ceramic can have a high and stable piezoelectric constant and a high and stable mechanical quality factor in a wide operating temperature range.

Curie Temperature

The term "Curie temperature", as used herein, refers to a temperature at which the ferroelectricity of ceramic is lost. In general, the piezoelectric property of piezoelectric ceramic is also lost at the Curie temperature or higher. The Curie temperature may be determined by directly measuring the temperature at which ferroelectricity is lost or measuring the temperature at which the relative dielectric constant reaches its maximum in a very small alternating electric field.

Crystal Grain Size and Equivalent Circular Diameter

The average equivalent circular diameter of crystal grains of a piezoelectric ceramic according to an embodiment of the present invention is preferably 1 μm or more and 10 μm or less. Having an average equivalent circular diameter of crystal grains in this range, a piezoelectric ceramic according to an embodiment of the present invention can have satisfactory piezoelectric property and mechanical strength. An average equivalent circular diameter of less than 1 μm may result in a deterioration in piezoelectric property. An average equivalent circular diameter of more than 10 μm may result in a reduced mechanical strength. The average equivalent circular diameter is more preferably 1 μm or more and 4.7 μm or less.

In a piezoelectric ceramic according to an embodiment of the present invention, crystal grains having an equivalent circular diameter of 25 μm or less may constitute 99 percent by number or more of the crystal grains of the piezoelectric ceramic. When the percentage by number of the crystal grains having an equivalent circular diameter of 25 μm or less is in this range, the piezoelectric ceramic can have a satisfactory mechanical strength. The mechanical strength has a high negative correlation with the percentage of crystal grains having a large equivalent circular diameter. When the percentage by number of crystal grains having an equivalent circular diameter of 25 μm or less is less than 99 percent by number, this results in an increase in crystal grains having an equivalent circular diameter of more than 25 μm, possibly resulting in a reduced mechanical strength.

The term "equivalent circular diameter", as used herein, refers to a "projected area equivalent circular diameter" generally referred to in microscopy and refers to the diameter of a perfect circle having the same area as the projected area of a crystal grain. In the present invention, the equivalent circular diameter may be determined by any method. For example, the equivalent circular diameter may be determined by the image processing of an image of a surface of the piezoelectric ceramic taken with a polarizing microscope or a scanning electron microscope. Since the optimum magnification depends on the particle size to be measured, an optical microscope or an electron microscope may be selected in accordance with the particle size. The equivalent circular diameter may be determined from an image of a polished surface or a cross section rather than the material surface.

Relative Density

A piezoelectric ceramic according to an embodiment of the present invention preferably has a relative density of 90% or more and 100% or less.

The relative density is the ratio of the measured density to the theoretical density, which is calculated from the lattice constant of the piezoelectric ceramic and the atomic weights of the constituent elements of the piezoelectric ceramic. The lattice constant can be measured by X-ray diffraction analysis. The density can be determined in accordance with Archimedes' principle.

A relative density of less than 90% may result in a deterioration in piezoelectric property, mechanical quality factor, or mechanical strength.

The lower limit of the relative density is more preferably 93% or more, still more preferably 95% or more.

A method for manufacturing a piezoelectric ceramic according to an embodiment of the present invention includes sintering a compact containing at least Ba, Ca, Ti, Sn, and Mn at a temperature of 1200° C. or less.

Method for Manufacturing Piezoelectric Ceramic According to Embodiment of Present Invention A method for manufacturing a piezoelectric ceramic according to an embodiment of the present invention will be described below.

Raw Materials for Piezoelectric Ceramic

A common method for sintering an oxide, carbonate, nitrate, or oxalate solid powder containing the constituent elements of a piezoelectric ceramic at atmospheric pressure may be employed in the manufacture of the piezoelectric ceramic. The raw materials include a metallic compound, such as a Ba compound, a Ca compound, a Ti compound, a Sn compound, a Zr compound, a Mn compound, a Cu compound, a B compound, and/or a Si compound.

Examples of the Ba compound include barium oxide, barium carbonate, barium oxalate, barium acetate, barium nitrate, barium titanate, barium zirconate, and barium zirconate titanate.

Examples of the Ca compound include calcium oxide, calcium carbonate, calcium oxalate, calcium acetate, calcium titanate, and calcium zirconate.

Examples of the Ti compound include titanium oxide, barium titanate, barium zirconate titanate, and calcium titanate.

Examples of the Zr compound include zirconium oxide, barium zirconate, barium zirconate titanate, and calcium zirconate.

Examples of the Sn compound include tin oxide, barium stannate, barium stannate titanate, and calcium stannate.

Examples of the Mn compound include manganese carbonate, manganese oxide, manganese dioxide, manganese acetate, and trimanganese tetroxide.

Examples of the Cu compound include copper(I) oxide, copper(II) oxide, copper carbonate, copper(II) acetate, and copper oxalate.

Examples of the B compound include boron oxide.

Examples of the Si compound include silicon oxide.

A raw material for controlling the value a representing the ratio of the number of moles of Ba and Ca at the A site to the number of moles of Ti, Sn, and Zr at the B site of the piezoelectric ceramic according to an embodiment of the present invention is not particularly limited. A Ba compound, a Ca compound, a Ti compound, a Sn compound, and a Zr compound have the same effect.

Granulated Powder and Compact

The term "compact", as used herein, refers to a solid formed of the solid powder described above. A compact can be formed by uniaxial pressing, cold hydrostatic pressing, hot hydrostatic pressing, casting, or extrusion molding. A compact may be formed using a granulated powder. Sintering of a compact formed of a granulated powder has an advantage that the grain size distribution of the sintered body tends to become uniform. In order to increase the density of the sintered body, the compact may contain a second auxiliary component containing at least one selected from the group consisting of Cu, B, and Si.

The raw material powder of a piezoelectric ceramic according to an embodiment of the present invention may be granulated by any method. Spray drying can make the particle size of the granulated powder more uniform.

A binder for use in granulation may be poly(vinyl alcohol) (PVA), poly(vinyl butyral) (PVB), or an acrylic resin. The amount of binder is preferably in the range of 1 part by weight to 10 parts by weight per 100 parts by weight of the raw material powder of the piezoelectric ceramic, more preferably 2 parts by weight to 5 parts by weight in order to increase the density of the compact.

Sintering

The compact may be sintered by any method.

Examples of the sintering method include sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature of the ceramic by the sintering method is 1200° C. or less. A homogeneous piezoelectric ceramic can be manufactured at a sintering temperature of 1200° C. or less. A sintering temperature of more than 1200° C. may result in the aggregation of the second auxiliary component and adversely affect the mechanical strength of the piezoelectric ceramic. The lower limit of the sintering temperature is not particularly limited and may be a temperature above which the compounds can react to sufficiently grow crystals. The sintering temperature is preferably 1000° C. or more and 1200° C. or less, more preferably 1100° C. or more and 1200° C. or less, such that the ceramic grain size is in the range of 1 to 10 μm. A piezoelectric ceramic sintered in the temperature range described above has satisfactory piezoelectric performance.

In order to ensure the reproducibility and stability of the characteristics of a piezoelectric ceramic manufactured by sintering, sintering may be performed at a constant temperature within the range described above for two hours or more and 24 hours or less. Two-step sintering may also be performed.

A piezoelectric ceramic manufactured by sintering may be polished and then heat-treated at a temperature of 1000° C. or more. Heat treatment of the piezoelectric ceramic at a temperature of 1000° C. or more can relieve the residual stress of the piezoelectric ceramic resulting from mechanically polishing and thereby improves the piezoelectric property of the piezoelectric ceramic. Heat treatment of the piezoelectric ceramic can also remove the raw material powder, such as barium carbonate, precipitated at grain boundaries. The heat-treatment time may be, but is not limited to, one hour or more.

Electrode

FIG. 1 is a schematic view of a piezoelectric element according to an embodiment of the present invention.

The piezoelectric element includes a first electrode 1, a piezoelectric ceramic 2, and a second electrode 3. The piezoelectric ceramic 2 is a piezoelectric ceramic according to an embodiment of the present invention.

The piezoelectric property of the piezoelectric ceramic 2 can be evaluated by at least attaching the first electrode 1 and the second electrode 3 to the piezoelectric ceramic 2 to form the piezoelectric element. The first electrode 1 and the second electrode 3 are electroconductive layers each having a thickness in the range of approximately 5 to 2000 nm. The materials of the first electrode 1 and the second electrode 3 are not particularly limited and may be any materials that are commonly used for piezoelectric elements. Examples of such materials include metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be made of one of these materials or may be a multilayer made of two or more of the materials. The material(s) of the first electrode 1 may be different from the material(s) of the second electrode 3.

The first electrode 1 and the second electrode 3 may be manufactured by any method, for example, by baking of a metal paste, sputtering, or vapor deposition. The first electrode 1 and the second electrode 3 may have a desired pattern.

Polarization Treatment

The piezoelectric element may have a unidirectional spontaneous polarization axis. Having the unidirectional spontaneous polarization axis can increase the piezoelectric constant of the piezoelectric element.

The polarization method for the piezoelectric element is not particularly limited. Polarization treatment may be performed in the ambient atmosphere or in a silicone oil. The polarization temperature may be in the range of 60° C. to 150° C. The optimum conditions for polarization may vary with the composition of the piezoelectric ceramic of the piezoelectric element. The electric field applied in polarization treatment may be in the range of 800 V/mm to 2.0 kV/mm.

Measurement of Piezoelectric Constant and Mechanical Quality Factor

The piezoelectric constant and the mechanical quality factor of the piezoelectric element can be calculated from the resonance frequency and the antiresonant frequency measured with a commercially available impedance analyzer in accordance with the Standard of Electronic Materials Manufacturers Association of Japan (EMAS-6100). This method is hereinafter referred to as a resonance-antiresonance method.

A multilayered piezoelectric element manufactured using a piezoelectric ceramic according to an embodiment of the present invention will be described below.

Structure of Multilayered Piezoelectric Element

A multilayered piezoelectric element according to an embodiment of the present invention includes piezoelectric ceramics and electrodes alternately stacked on top of one another. The electrodes include an internal electrode. Each of the piezoelectric ceramics is a piezoelectric ceramic according to an embodiment of the present invention.

Figure 2A:
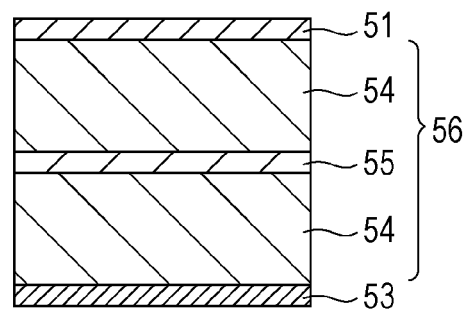
FIG. 2A is a schematic cross-sectional view of a multilayered piezoelectric element according to an embodiment of the present invention.
Figure 2B:
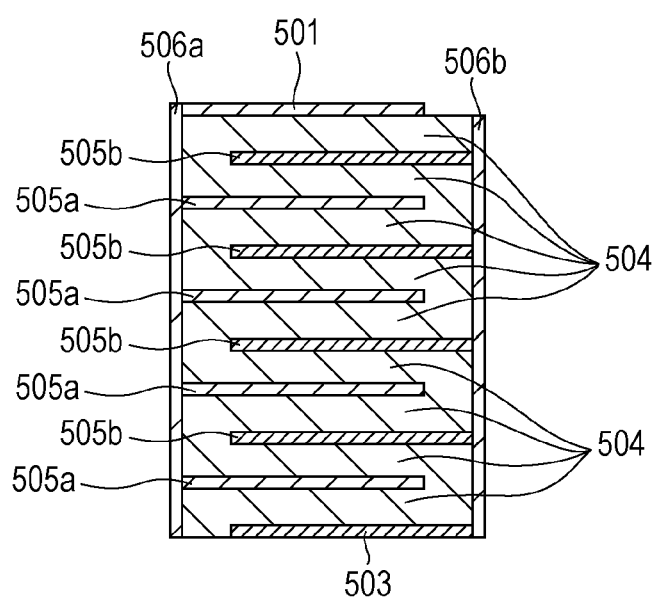
FIG. 2B is a schematic cross-sectional view of a multilayered piezoelectric element according to another embodiment of the present invention.

FIGS. 2A and 2B are schematic cross-sectional views of a multilayered piezoelectric element according to an embodiment of the present invention. A multilayered piezoelectric element according to an embodiment of the present invention includes piezoelectric ceramic layers 54 and electrodes alternately stacked on top of one another. The electrodes include an internal electrode 55. Each of the piezoelectric ceramic layers 54 is a piezoelectric ceramic according to an embodiment of the present invention. In addition to the internal electrode 55, the electrodes may include external electrodes, such as a first electrode 51 and a second electrode 53.

The multilayered piezoelectric element illustrated in FIG. 2A includes two piezoelectric ceramic layers 54 and one internal electrode 55 interposed therebetween, and the multilayered structure is disposed between the first electrode 51 and the second electrode 53. The number of piezoelectric ceramic layers and the number of internal electrodes are not particularly limited and may be increased, as illustrated in FIG. 2B. The multilayered piezoelectric element illustrated in FIG. 2B includes nine piezoelectric ceramic layers 504 and eight internal electrodes 505 alternately stacked on top of one another, and the multilayered structure is disposed between a first electrode 501 and a second electrode 503. The multilayered piezoelectric element further includes an external electrode 506a and an external electrode 506b for connecting the internal electrodes 505 to each other.

The size and shape of the internal electrodes 505 and the external electrodes 506a and 506b may be different from the size and shape of the piezoelectric ceramic layers 504. Each of the internal electrodes 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is an electroconductive layer having a thickness in the range of approximately 5 to 2000 nm. The materials of the internal electrodes 55 and 505, the external electrodes 506a and 506b, the first electrodes 51 and 501, and the second electrodes 53 and 503 are not particularly limited and may be any materials that are commonly used for piezoelectric elements. Examples of such materials include metals, such as Ti, Pt, Ta, Ir, Sr, In, Sn, Au, Al, Fe, Cr, Ni, Pd, Ag, and Cu, and compounds thereof. Each of the internal electrodes 505 and the external electrodes 506a and 506b may be made of one of these materials or a mixture or an alloy thereof or may be a multilayer made of two or more of the materials. These electrodes may be made of different materials.

The internal electrode(s) 55 or 505 may contain Ag and Pd. The weight ratio $M1/M2$ of the weight $M1$ of Ag to the weight $M2$ of Pd is preferably in the range of $0.25 \leq M1/M2 \leq 4.0$, more preferably $0.3 \leq M1/M2 \leq 3.0$. A weight ratio $M1/M2$ of less than 0.25 is undesirable because of a high sintering temperature of the internal electrode. A weight ratio $M1/M2$ of more than 4.0 is also undesirable because the internal electrode has an island structure and a heterogeneous surface.

As illustrated in FIG. 2B, the plurality of electrodes including the internal electrodes 505 may be connected to each other in order to synchronize the driving voltage phases. For example, internal electrodes 505a may be connected to the first electrode 501 through the external electrode 506a. Internal electrodes 505b may be connected to the second electrode 503 through the external electrode 506b. The internal electrodes 505a and the internal electrodes 505b may be alternately disposed. The electrodes may be connected by any method. For example, an electrode or an electric wire for connection may be disposed on a side surface of the multilayered piezoelectric element, or a through hole passing through the piezoelectric ceramic layers 504 may be formed and coated with an electroconductive material to connect the electrodes.

Method for Manufacturing Multilayered Piezoelectric Element

A method for manufacturing a multilayered piezoelectric element using a piezoelectric ceramic according to an embodiment of the present invention will be described below.

A method for manufacturing a multilayered piezoelectric element according to an embodiment of the present invention includes (A) dispersing a metallic compound powder containing at least Ba, Ca, Ti, Sn, and Mn to produce a slurry; (B) forming a compact from the slurry; (C) forming an electrode on the compact; and (D) sintering a plurality of the compacts at a temperature of 1200° C. or less to manufacture the multilayered piezoelectric element. The metal oxide powder may contain Zr. The term "powder", as used herein, refers to an aggregate of solid particles. The aggregate may be composed of particles each containing Ba, Ca, Ti, Sn, Zr, and Mn or different particles each containing a certain element.

The metallic compound powder used in (A) may be a powder of a Ba compound, a Ca compound, a Ti compound, a Sn compound, a Zr compound, a Mn compound, a Cu compound, a B compound, and/or a Si compound. Examples of the Ba compound include barium oxide, barium carbonate, barium oxalate, barium acetate, barium nitrate, barium titanate, barium zirconate, and barium zirconate titanate.

Examples of the Ca compound include calcium oxide, calcium carbonate, calcium oxalate, calcium acetate, calcium titanate, calcium zirconate, and calcium zirconate titanate.

Examples of the Ti compound include titanium oxide, barium titanate, barium zirconate titanate, and calcium titanate.

Examples of the Zr compound include zirconium oxide, barium zirconate, barium zirconate titanate, and calcium zirconate.

Examples of the Sn compound include tin oxide, barium stannate, barium stannate titanate, and calcium stannate.

Examples of the Mn compound include manganese carbonate, manganese oxide, manganese dioxide, manganese acetate, and trimanganese tetroxide.

Examples of the Cu compound include copper(I) oxide, copper(II) oxide, copper carbonate, copper(II) acetate, and copper oxalate.

Examples of the B compound include boron oxide.

Examples of the Si compound include silicon oxide.

An exemplary method for preparing the slurry in (A) will be described below. The metallic compound powder is mixed with a solvent. The weight of the solvent is 1.6 to 1.7 times the weight of the metallic compound powder. The solvent may be toluene, ethanol, a mixed solvent of toluene and ethanol, n-butyl acetate, or water. After mixing in a ball mill for 24 hours, a binder and a plasticizer are added to the mixture. The binder may be poly(vinyl alcohol) (PVA), poly(vinyl butyral) (PVB), or an acrylic resin. When the binder is PVB, the weight ratio of the solvent to PVB may be 88:12. The plasticizer may be dioctyl sebacate, dioctyl phthalate, or dibutyl phthalate. When the plasticizer is dibutyl phthalate, the weight of dibutyl phthalate is the same as the weight of the binder. The mixture is again mixed in the ball mill overnight. The amount of solvent or binder is controlled such that the slurry viscosity is in the range of 300 to 500 mPa·s.

The compact in (B) is a sheet of the mixture of the metallic compound powder, the binder, and the plasticizer. The compact in (B) may be formed by a sheet forming method. The sheet forming method may be a doctor blade method. In accordance with the doctor blade method, the slurry is applied to a substrate with a doctor blade and is dried to form a sheet of the compact. The substrate may be a poly(ethylene terephthalate) (PET) film. A surface of the PET film on which the slurry is to be applied may be coated with a fluorine compound in order to facilitate the removal of the compact. The slurry may be dried by natural drying or hot-air drying. The thickness of the compact is not particularly limited and may be adjusted to the thickness of the multilayered piezoelectric element. The thickness of the compact can be increased with increasing viscosity of the slurry.

The electrode in (C), more specifically, the internal electrodes 505 and the external electrodes 506a and 506b may be manufactured by any method, for example, baking of a metal paste, a sputtering process, a vapor deposition method, or a printing method. In order to reduce the driving voltage, the thickness and the intervals of piezoelectric ceramic layers 504 may be reduced. In such a case, a multilayered body containing precursors of the piezoelectric ceramic layers 504 and the internal electrodes 505 is fired. The material of the internal electrodes 505 should not change its shape or cause a deterioration in electrical conductivity at the sintering temperature of the piezoelectric ceramic layers 504. The sintering temperature of the piezoelectric ceramic is in the range of 1100° C. to 1200° C., which is lower than the sintering temperature of conventional barium titanate piezoelectric ceramics. Thus, a metal that has a lower melting point and is more inexpensive than Pt, such as Ag, Pd, Au, Cu, or Ni, or an alloy thereof may be used for the internal electrodes 505 and external electrodes 506a and 506b. The external electrodes 506a and 506b may be formed after firing the multilayered body. In this case, the external electrodes 506a and 506b may be made of Al or a carbonaceous electrode material, as well as Ag, Pd, Cu, or Ni.

These electrodes may be formed by screen printing. In accordance with screen printing, a metal paste is applied to the compact disposed on a substrate through a screen printing plate using a blade. The screen printing plate has a screen mesh. The metal paste is applied to the compact through the screen mesh. The screen mesh of the screen printing plate may have a pattern. The pattern can be transferred to the compact using the metal paste, thereby patterning an electrode on the compact.

After the electrode is formed in (C), one or a plurality of compacts removed from the substrate are stacked and press-bonded, for example, by uniaxial pressing, cold hydrostatic pressing, or hot hydrostatic pressing. Hot hydrostatic pressing can apply isotropically uniform pressure. Heating the compacts to approximately the glass transition point of the binder can enhance press bonding. A plurality of compacts can be press-bonded in order to achieve the desired thickness. For example, 10 to 100 layers of the compacts can be heat-pressed at a temperature in the range of 50° C. to 80° C. at a pressure in the range of 10 to 60 MPa for 10 seconds to 10 minutes. The electrodes may have an alignment mark in order to accurately stack the compacts. The compacts may have a positioning through hole in order to accurately stack the compacts.

A sintering temperature of 1200° C. or less in (D) allows the use of a metal that has a lower melting point and is more inexpensive than Pt, such as Ag, Pd, Au, Cu, or Ni, or an alloy thereof.

In a method for manufacturing a multilayered piezoelectric element according to an embodiment of the present invention, the slurry may contain a perovskite type metal oxide containing at least one of Ba and Ca and at least one of Ti and Sn. Examples of the perovskite type metal oxide include barium titanate, barium stannate, barium zirconate titanate, barium stannate titanate, calcium titanate, calcium stannate, calcium zirconate titanate, and calcium stannate titanate. The slurry may contain Zr. In this case, the perovskite type metal oxide may be barium zirconate or calcium zirconate.

When the slurry contains the perovskite type metal oxide, this advantageously promotes grain growth and increases the density of the compact.

Liquid Discharge Head

A liquid discharge head according to an embodiment of the present invention includes a liquid chamber and a discharge port in communication with the liquid chamber. The liquid chamber has a vibrating unit that includes a piezoelectric element or a multilayered piezoelectric element according to an embodiment of the present invention.

Figure 3A:
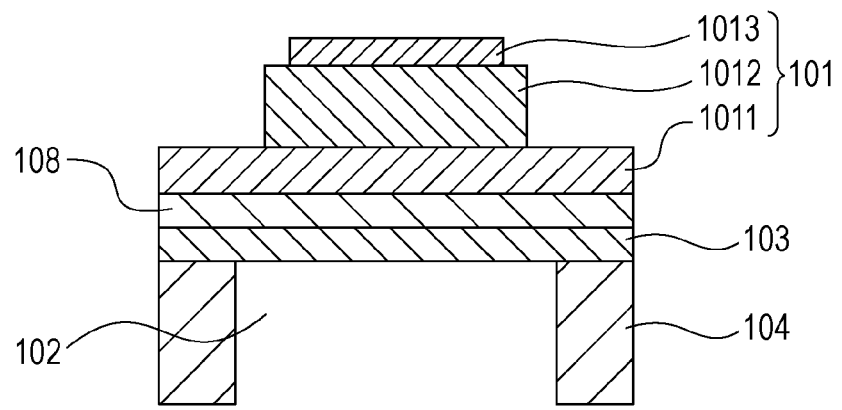
FIG. 3A is a schematic cross-sectional view of a liquid discharge head according to an embodiment of the present invention.
Figure 3B:
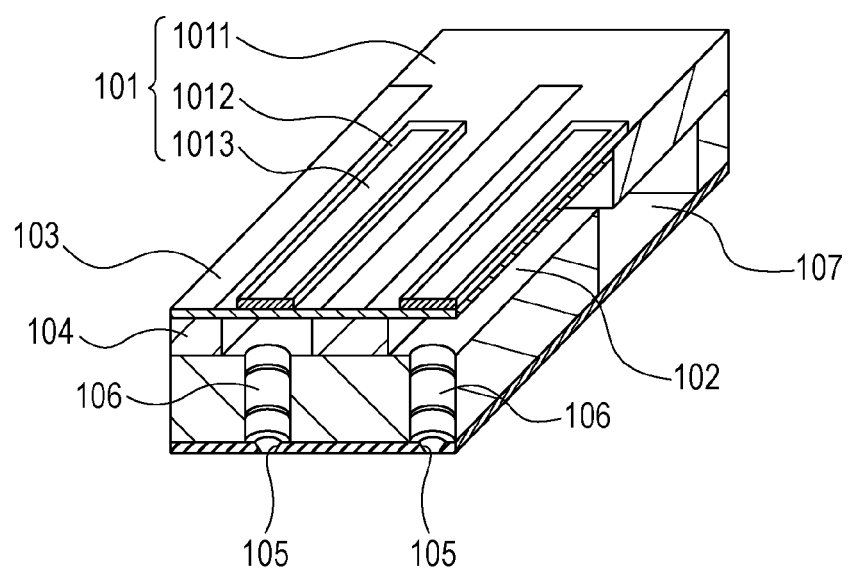
FIG. 3B is a schematic perspective view of the liquid discharge head illustrated in FIG. 3A.

FIG. 3A is a schematic cross-sectional view of a liquid discharge head according to an embodiment of the present invention. FIG. 3B is a schematic perspective view of the liquid discharge head illustrated in FIG. 3A. As illustrated in FIGS. 3A and 3B, the liquid discharge head includes a piezoelectric element 101 according to an embodiment of the present invention. The piezoelectric element 101 includes a first electrode 1011, a piezoelectric ceramic 1012, and a second electrode 1013. As illustrated in FIG. 3B, the piezoelectric ceramic 1012 may be patterned.

FIG. 3B is a schematic perspective view of the liquid discharge head. The liquid discharge head includes a discharge port 105, an individual liquid chamber 102, a communicating hole 106 that connects the individual liquid chamber 102 to the discharge port 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric ceramic 1012 has a shape similar to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric ceramic 1012, thereby applying pressure to a liquid in the individual liquid chamber 102. This allows the liquid to be discharged from the discharge port 105. A liquid discharge head according to an embodiment of the present invention can be used in printers and in the manufacture of electronic equipment.

The thickness of the diaphragm 103 is 1.0 µm or more and 15 µm or less, preferably 1.5 µm or more and 8 µm or less. The diaphragm 103 may be made of any material, for example, Si. The diaphragm 103 made of Si may be doped with boron or phosphorus. The buffer layer 108 and the first electrode 1011 on the diaphragm 103 may serve as part of the diaphragm 103. The buffer layer 108 has a thickness of 5 nm or more and 300 nm or less, preferably 10 nm or more and 200 nm or less. The discharge port 105 has an equivalent circular diameter of 5 µm or more and 40 µm or less. The discharge port 105 may be circular, star-shaped, square, or triangular.

Liquid Discharge Apparatus

A liquid discharge apparatus according to an embodiment of the present invention will be described below. The liquid discharge apparatus includes a recording medium conveying unit and the liquid discharge head described above.

Figure 4:
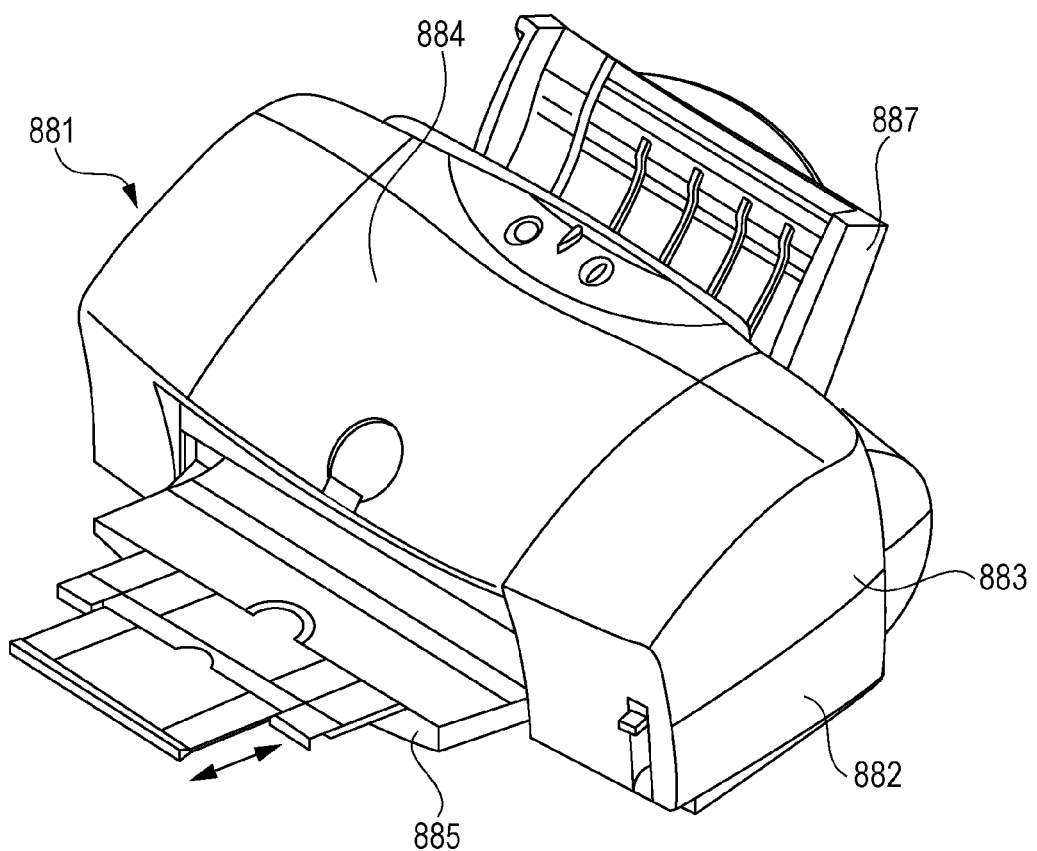
FIG. 4 is a schematic view of a liquid discharge apparatus according to an embodiment of the present invention.
Figure 5:
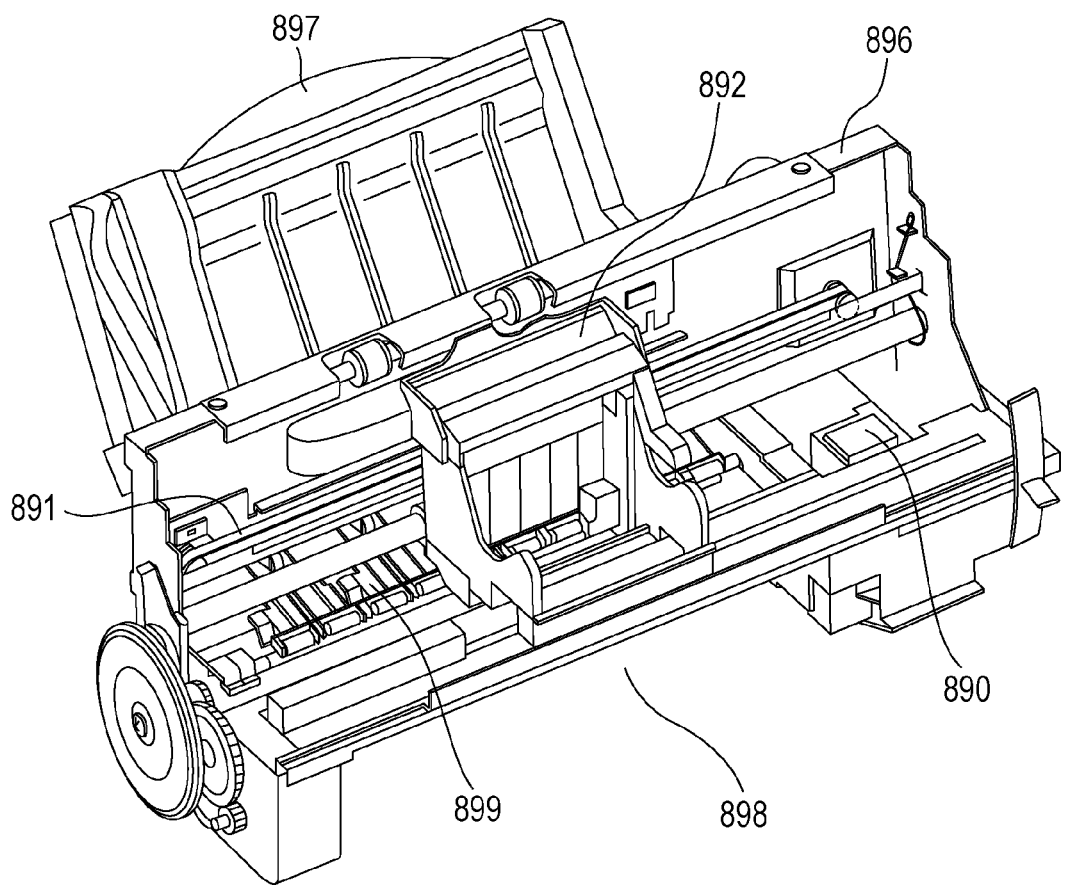
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a recording medium to the main body 896 of the apparatus. The ink jet recording apparatus 881 further includes a conveying unit 899 for conveying a recording paper sheet from the automatic feeder 897 to a predetermined recording position and from the recording position to an outlet 898, a recording unit 891 for recording to the recording paper at the recording position, and a recovering unit 890 for recovering the recording unit 891. The recording unit 891 includes a carriage 892 for housing a liquid discharge head according to an embodiment of the present invention. The carriage 892 travels along a rail.

The carriage 892 travels along a rail in response to electric signals sent from a computer. Upon the application of a driving voltage to electrodes disposed on a piezoelectric ceramic, the piezoelectric ceramic is deformed. Upon the deformation, the piezoelectric ceramic presses the individual liquid chamber 102 via the diaphragm 103 illustrated in FIG. 3B, thereby discharging an ink from the discharge port 105 to print characters.

A liquid discharge apparatus according to an embodiment of the present invention can uniformly discharge a liquid at a high speed and can be reduced in size.

In addition to the printer described above, a liquid discharge apparatus according to an embodiment of the present invention can be used in other ink jet recording apparatuses, such as facsimile machines, multifunction devices, and copying machines, and industrial liquid discharge apparatuses.

Ultrasonic Motor

An ultrasonic motor according to an embodiment of the present invention includes a vibrating member and a moving body in contact with the vibrating member. The vibrating member includes a piezoelectric element or a multilayered piezoelectric element according to an embodiment of the present invention.

Figure 6A:
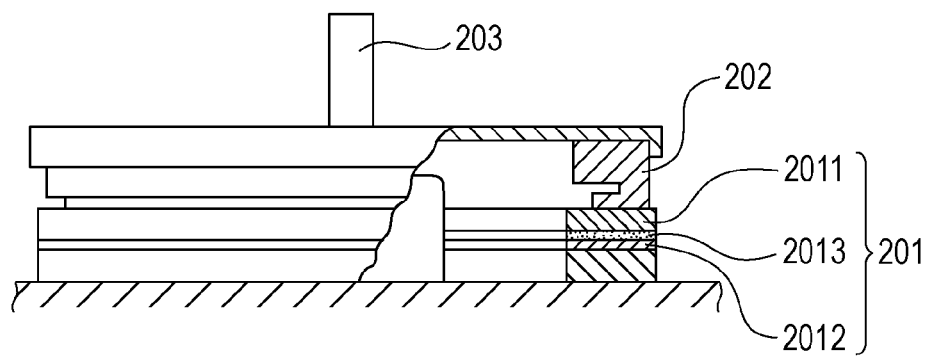
FIG. 6A is a schematic view of an ultrasonic motor according to an embodiment of the present invention.
Figure 6B:
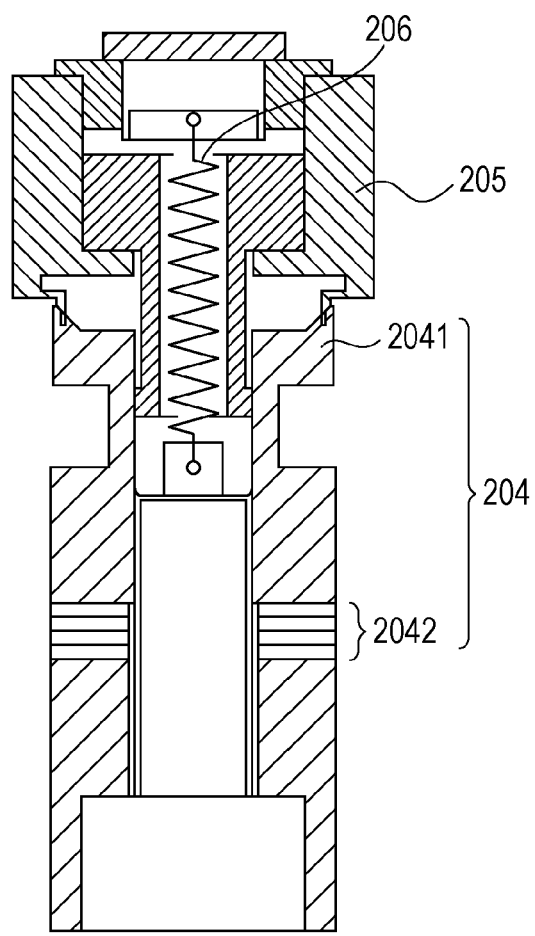
FIG. 6B is a schematic view of an ultrasonic motor according to another embodiment of the present invention.

FIG. 6A is a schematic view of an ultrasonic motor according to an embodiment of the present invention. FIG. 6B is a schematic view of an ultrasonic motor according to another embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (epoxy or cyanoacrylate) that bonds the piezoelectric element 2012 to the elastic ring 2011. Although not shown in the figure, the piezoelectric element 2012 includes a piezoelectric ceramic between a first electrode and a second electrode.

Upon the application of two-phase alternating voltages that differ by an odd number times π/4 in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202.

Upon the application of a voltage to a piezoelectric ceramic, the piezoelectric ceramic expands and contracts because of the transverse piezoelectric effect. An elastic body, such as a metal, joined to the piezoelectric element is bent with the expansion and contraction of the piezoelectric ceramic. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric ceramics (not shown) and includes a first electrode and a second electrode on the outer surfaces of the layered piezoelectric ceramics and internal electrodes within the layered piezoelectric ceramics. The metal elastic body 2041 is fastened with a bolt to hold the piezoelectric element 2042, thereby constituting the oscillator 204.

Upon the application of alternating voltages of different phases to the piezoelectric element 2042, the oscillator 204 causes two oscillations perpendicular to each other. The two oscillations are synthesized to form a circular oscillation for driving the tip of the oscillator 204. The oscillator 204 has an annular groove at its upper portion. The annular groove increases the oscillatory displacement for driving.

A rotor 205 is pressed against the oscillator 204 by the action of a pressure spring 206 and receives friction force for driving. The rotor 205 is rotatably supported by a bearing.

Optical Apparatus

An optical apparatus according to an embodiment of the present invention will be described below. The optical apparatus includes the ultrasonic motor described above in a drive unit.

Figure 7A:
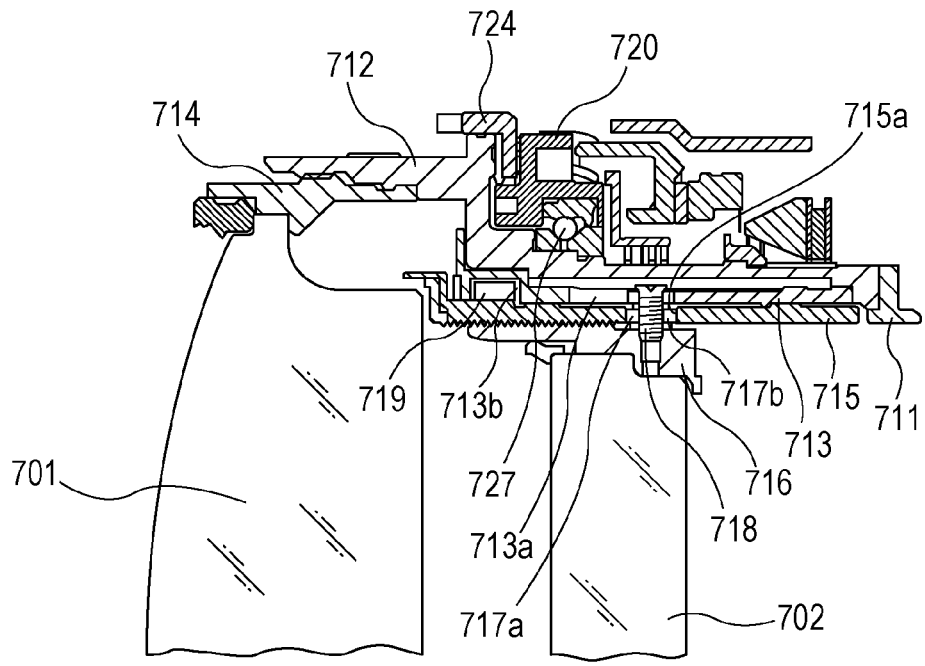
FIGS. 7A and 7B are schematic views of an optical apparatus according to an embodiment of the present invention.
Figure 7B:
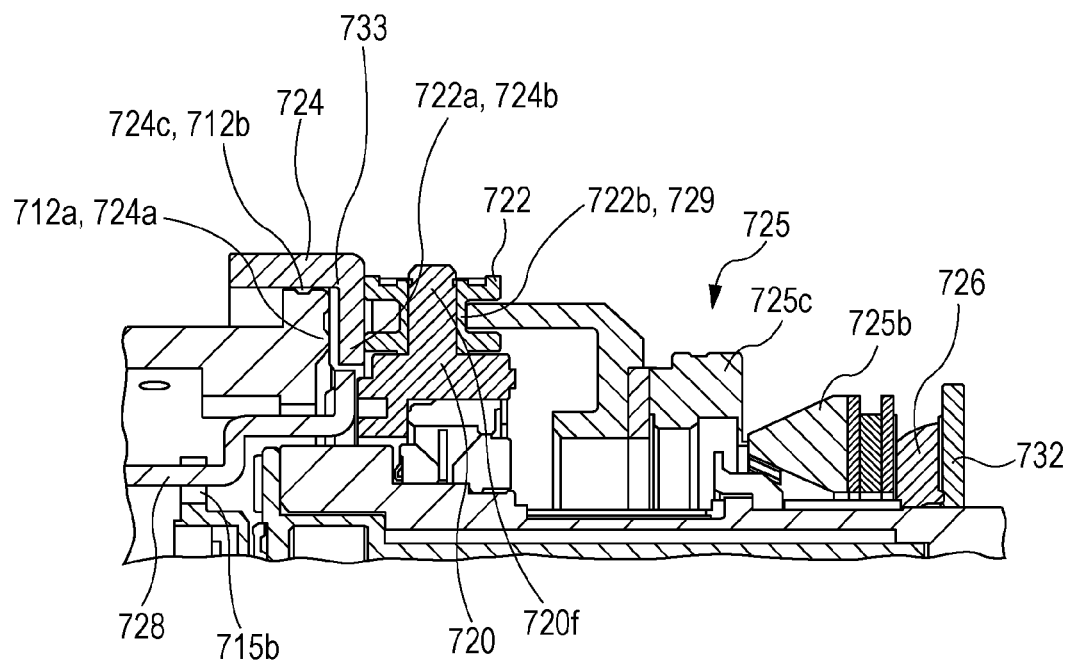

FIGS. 7A and 7B are cross-sectional views of an interchangeable lens barrel of a single-lens reflex camera, which is an image pickup apparatus according to an embodiment of the present invention. FIG. 8 is an exploded perspective view of an interchangeable lens barrel of a single-lens reflex camera, which is an image pickup apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the inner diameter 724c of the manual focus ring 724. The inner diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring 724 because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is pressed against the joint 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and furthermore presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input unit (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f because of friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear group lens barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras and electronic still cameras.

Vibratory Apparatus and Dust Removing Device

Vibratory apparatuses for conveying or removing particles, powders, and liquids are widely used in electronic equipment. A dust removing device will be described below as an example of a vibratory apparatus including a vibrating member that includes a piezoelectric element or a multilayered piezoelectric element according to an embodiment of the present invention.

A dust removing device according to an embodiment of the present invention includes a vibrating member that includes a piezoelectric element or a multilayered piezoelectric element according to an embodiment of the present invention.

Figure 9A:
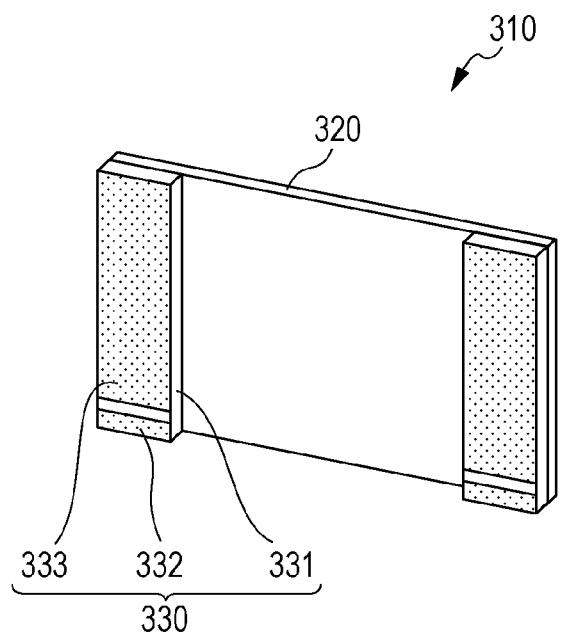
FIGS. 9A and 9B are schematic views of a dust removing device according to an embodiment of the present invention.
Figure 9B:
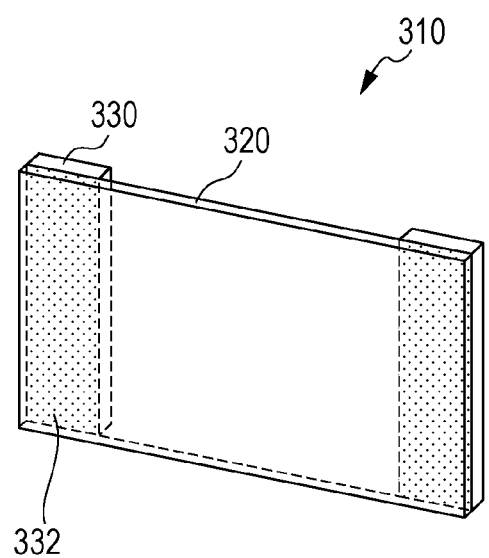

FIGS. 9A and 9B are schematic views of a dust removing device 310 according to an embodiment of the present invention. The dust removing device 310 includes a plate of the piezoelectric element 330 and the diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a translucent or transparent material or a light reflective material.

Figure 10A:
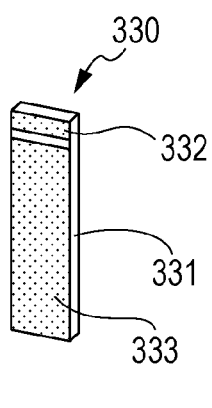
FIG. 10A is a schematic perspective view of a piezoelectric element of a dust removing device according to an embodiment of the present invention.
Figure 10B:
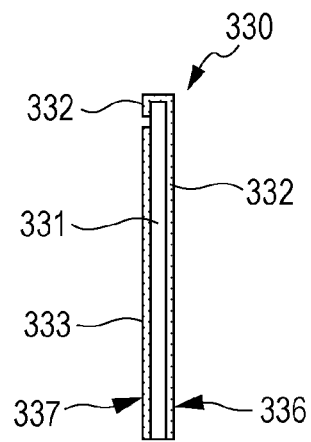
FIG. 10B is a side view of the piezoelectric element illustrated in FIG. 10A.
Figure 10C:
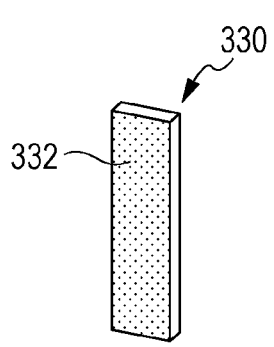
FIG. 10C is a schematic perspective view of the piezoelectric element illustrated in FIG. 10A.

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIG. 10A to 10C, the piezoelectric element 330 includes a piezoelectric ceramic 331, a first electrode 332, and a second electrode 333. The first electrode 332 and the second electrode 333 are disposed on opposite sides of the piezoelectric ceramic 331. As in FIGS. 9A and 9B, the piezoelectric element 330 may be a multilayered piezoelectric element according to an embodiment of the present invention. In this case, the piezoelectric ceramic 331 includes piezoelectric ceramics and internal electrodes alternately stacked on top of one another. The internal electrodes are alternately connected to the first electrode 332 and the second electrode 333, thereby allowing the piezoelectric ceramic layers to alternately have a drive waveform of a different phase. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, causing out-of-plane oscillations on the diaphragm 320. The dust removing device 310 removes foreign matter, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figure 11A:
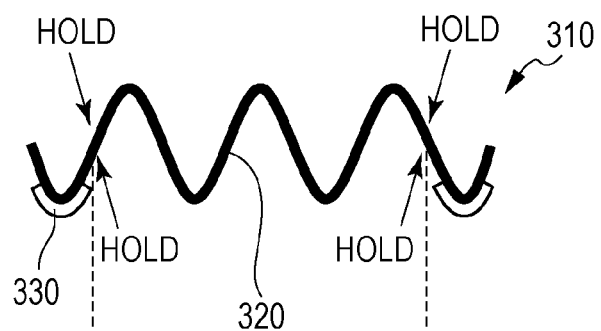
FIGS. 11A and 11B are schematic views illustrating the vibration principle of a dust removing device according to an embodiment of the present invention.
Figure 11B:
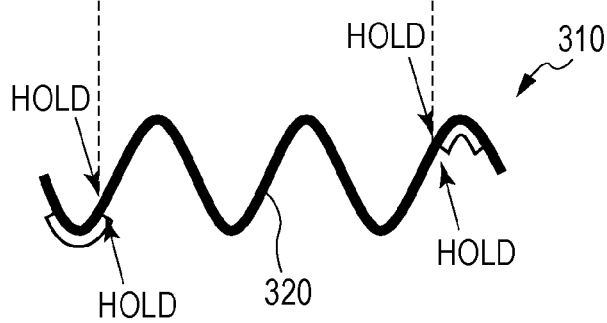

FIGS. 11A and 11B are schematic views illustrating the vibration principle of a dust removing device 310 according to an embodiment of the present invention. In FIG. 11A, an in-phase alternating electric field is applied to a left-and-right pair of the piezoelectric elements 330 to cause out-of-plane oscillations of the diaphragm 320. The direction of polarization of the piezoelectric ceramic constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

Image Pickup Apparatus

Figure 12:
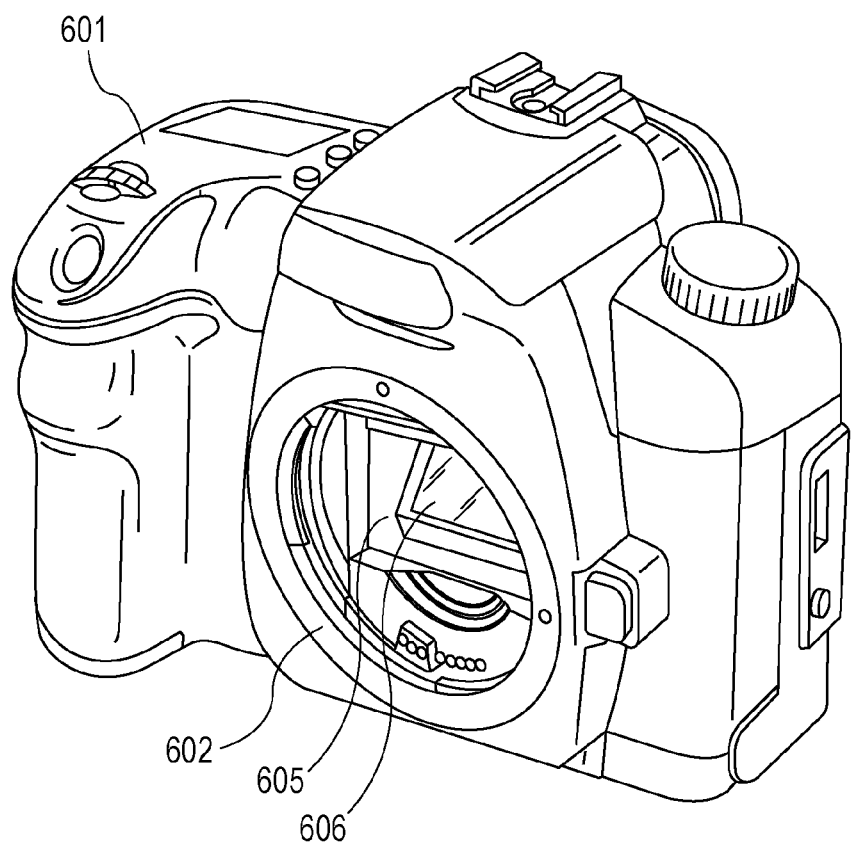
FIG. 12 is a schematic view of an image pickup apparatus according to an embodiment of the present invention.
Figure 13:
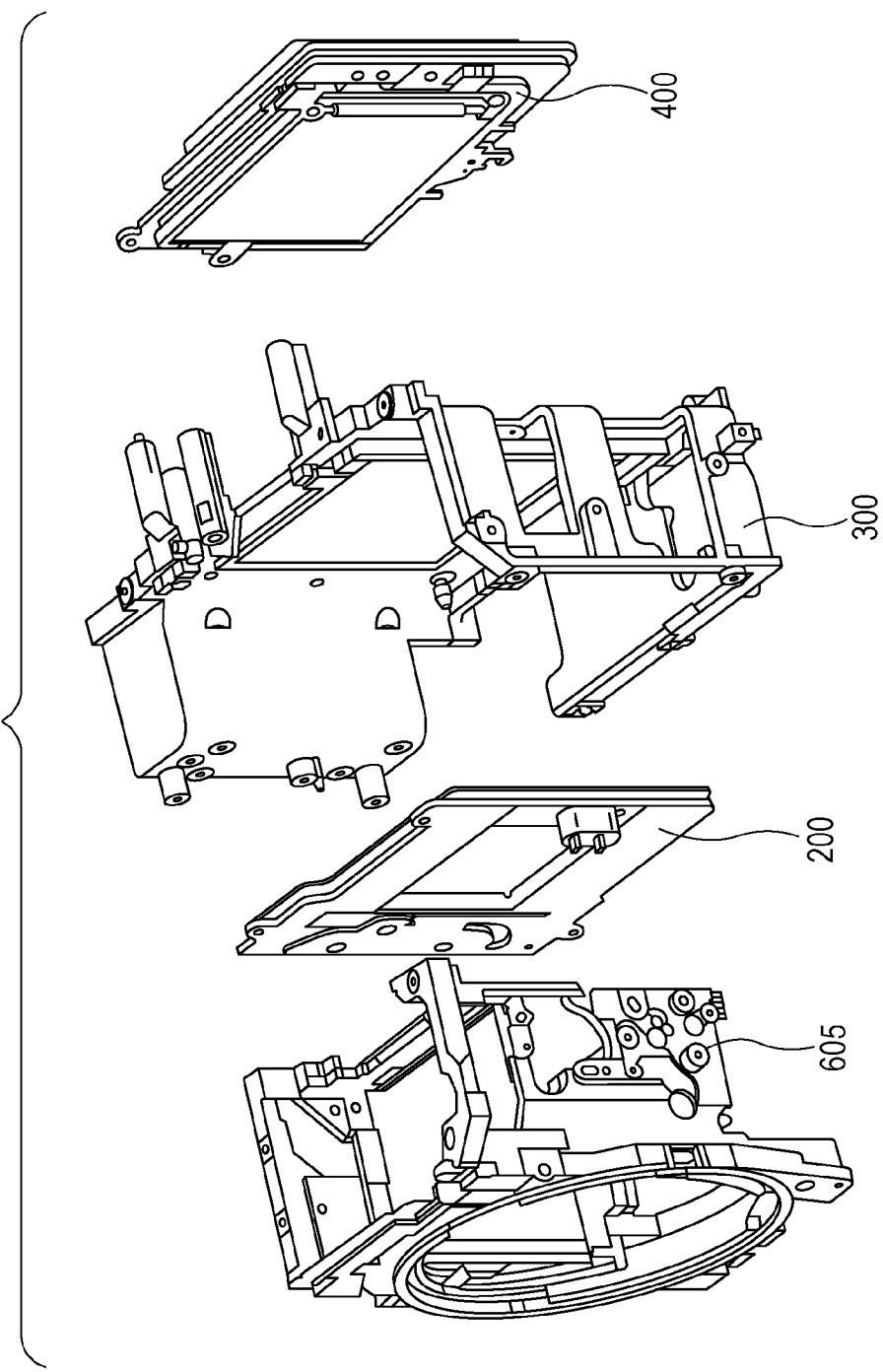
FIG. 13 is a schematic view of an image pickup apparatus according to an embodiment of the present invention.

An image pickup apparatus according to an embodiment of the present invention will be described below. An image pickup apparatus according to an embodiment of the present invention includes a dust removing device according to an embodiment of the present invention and an image pickup element unit, wherein the dust removing device includes a vibrating member on the light-receiving surface of the image pickup element unit. FIGS. 12 and 13 illustrate a digital single-lens reflex camera, which is an image pickup apparatus according to an embodiment of the present invention.

FIG. 12 is a front perspective view of the main body 601 of the camera viewed from the object side. An imaging lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through an imaging lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which an imaging lens unit is to be attached.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copying machines, facsimile machines, and scanners, an image pickup apparatus according to an embodiment of the present invention can particularly be applied to devices that require the removal of dust deposited on a surface of an optical component.

Electronic Equipment

Electronic equipment according to an embodiment of the present invention will be described below. The electronic equipment includes a piezoelectric acoustic component that includes a piezoelectric element or a multilayered piezoelectric element according to an embodiment of the present invention. The piezoelectric acoustic component may be a loudspeaker, a buzzer, a microphone, or a surface acoustic wave (SAW) device.

Figure 14:
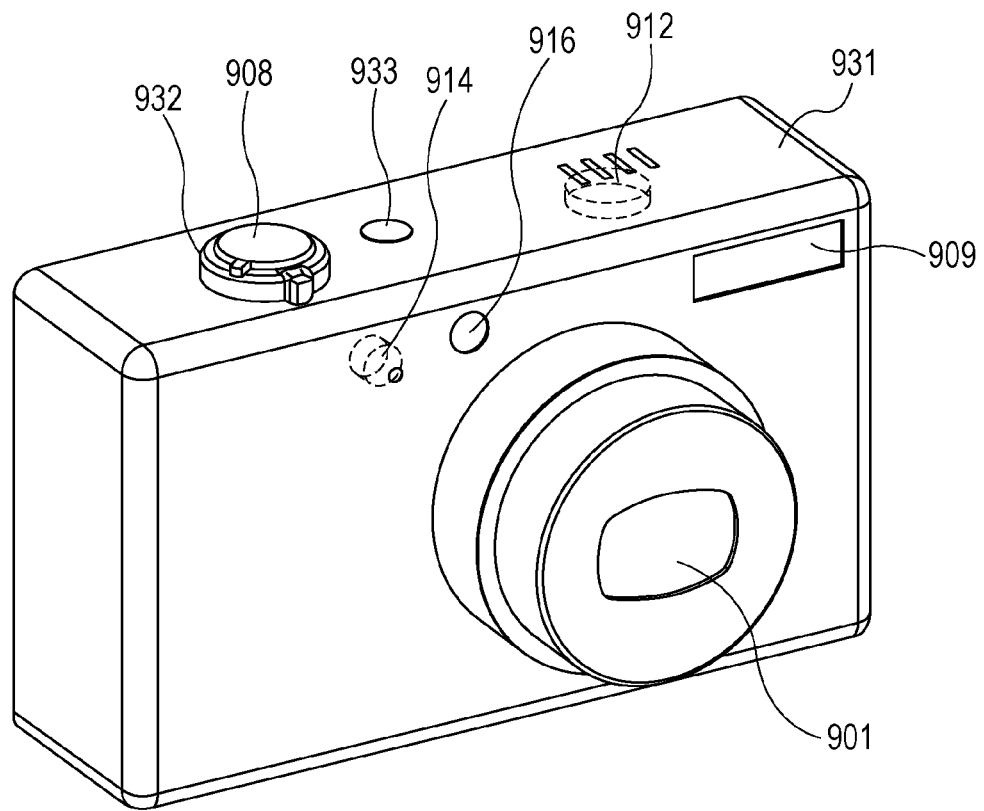
FIG. 14 is a schematic view of electronic equipment according to an embodiment of the present invention.
Figure 15A:
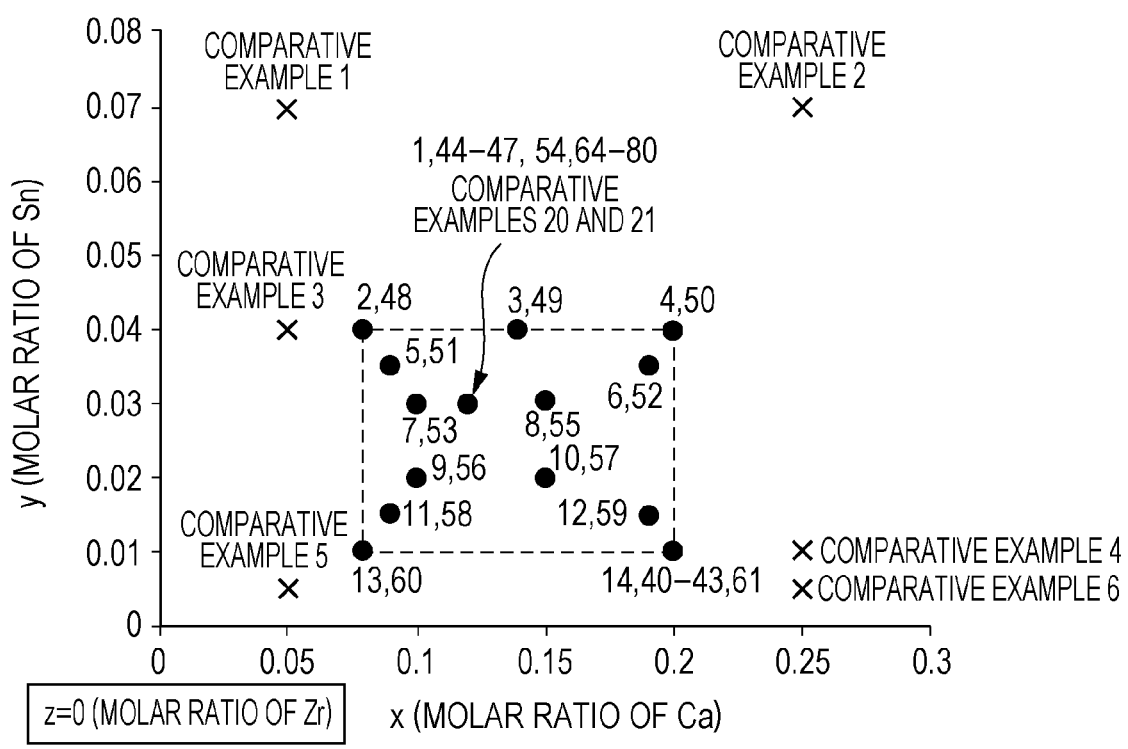
FIGS. 15A to 15C are phase diagrams illustrating the relationship between x-values, y-values, and z-values of piezoelectric ceramics according to Examples 1 to 80 and ceramics according to Comparative Examples 1 to 23 of the present invention. The x-values and the y-values surrounded by the dotted line are within the scope of Claim 1.
Figure 15B:
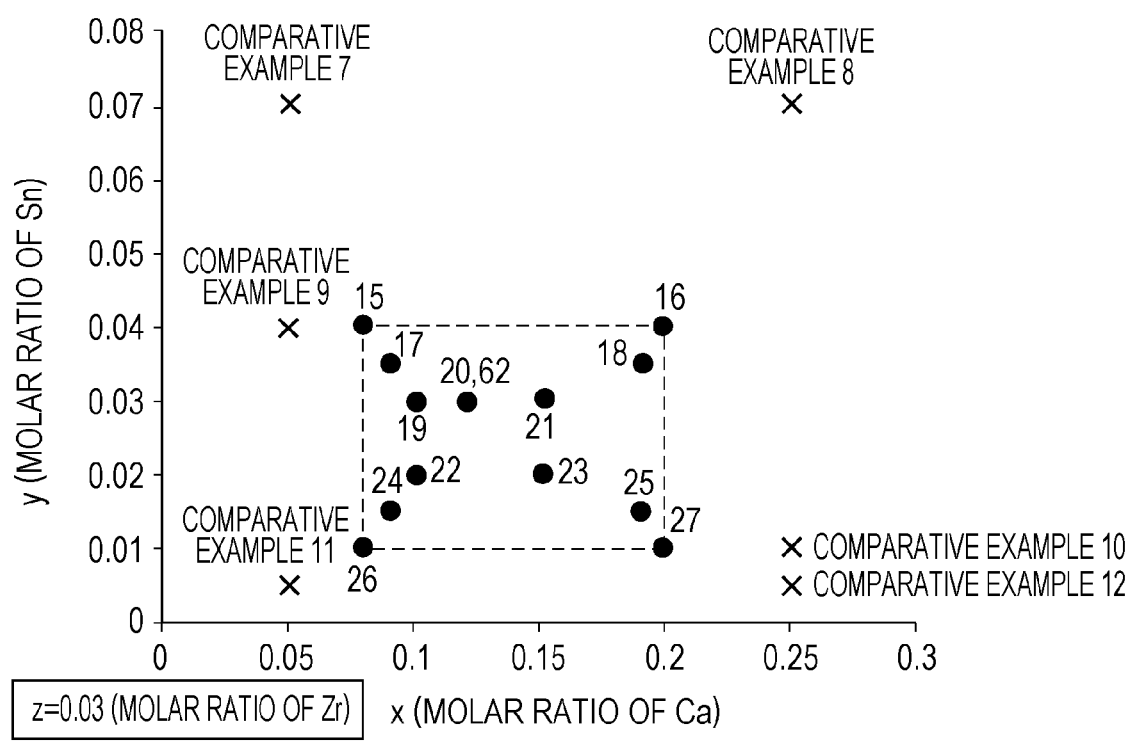
Figure 15C:
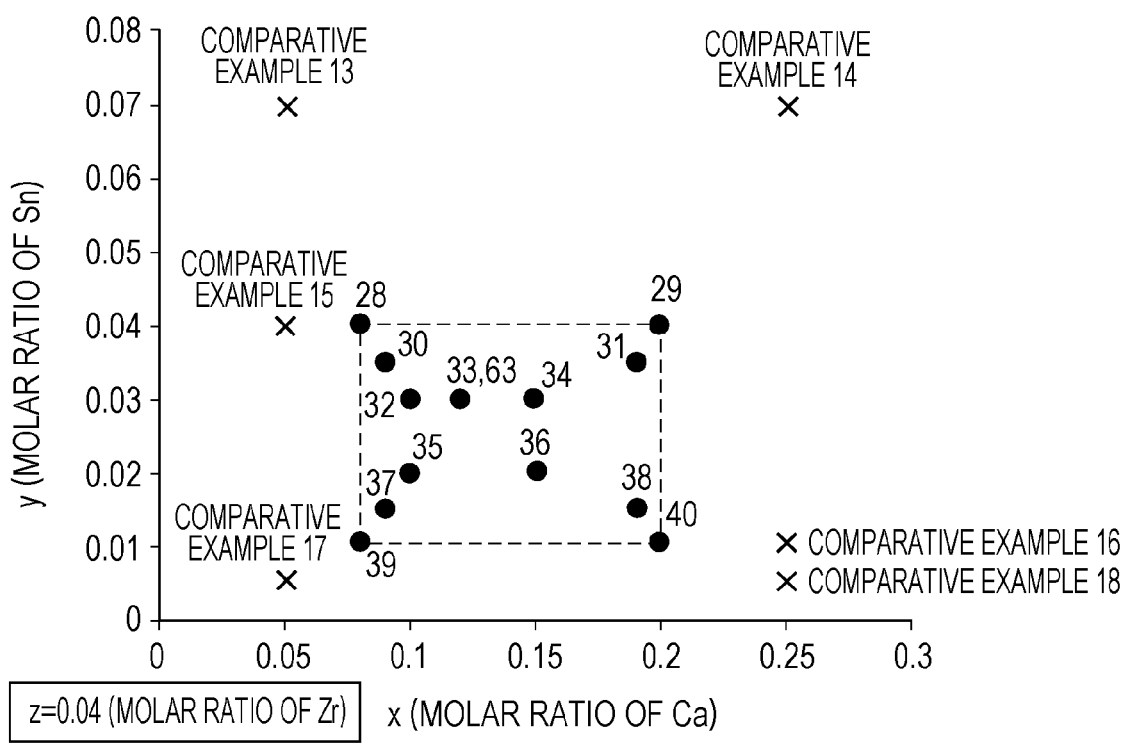
Figure 15D:
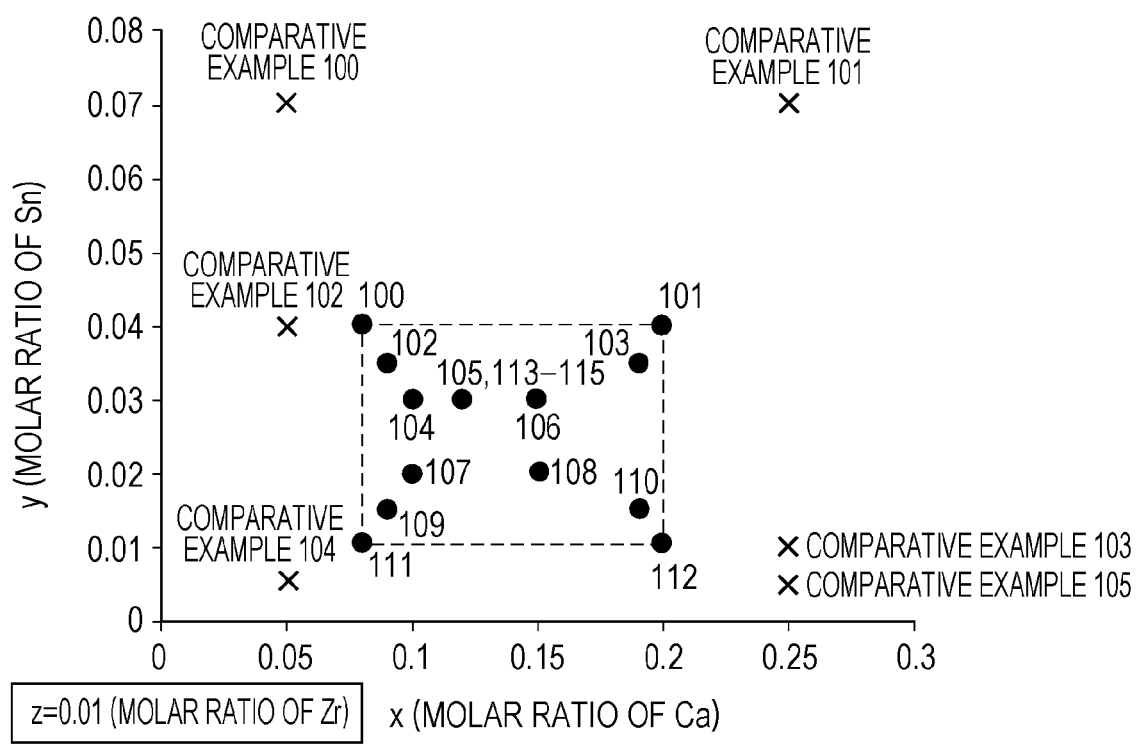
FIG. 15D is phase diagram illustrating the relationship between x-values, y-values, and z-values of piezoelectric ceramics according to Examples 100 to 115 and ceramics according to Comparative Examples 100 to 105.

FIG. 14 is a perspective view of the main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multilayered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment.

A liquid discharge head manufactured by using a lead-free piezoelectric ceramic according to an embodiment of the present invention can have a nozzle density and discharge capacity higher than or equal to those of liquid discharge heads manufactured by using a lead-containing piezoelectric ceramic.

A liquid discharge apparatus manufactured by using a lead-free piezoelectric ceramic according to an embodiment of the present invention can have a discharge velocity and discharge accuracy higher than or equal to those of liquid discharge apparatuses manufactured by using a lead-containing piezoelectric ceramic.

An ultrasonic motor manufactured by using a lead-free piezoelectric ceramic according to an embodiment of the present invention can have driving force and durability higher than or equal to those of ultrasonic motors manufactured by using a lead-containing piezoelectric ceramic.

An optical apparatus manufactured by using a lead-free piezoelectric ceramic according to an embodiment of the present invention can have durability and operation accuracy higher than or equal to those of optical apparatuses manufactured by using a lead-containing piezoelectric ceramic.

A vibratory apparatus manufactured by using a lead-free piezoelectric ceramic according to an embodiment of the present invention can have oscillation capability and durability higher than or equal to those of vibratory apparatuses manufactured by using a lead-containing piezoelectric ceramic.

A dust removing device manufactured by using a lead-free piezoelectric ceramic according to an embodiment of the present invention can have dust removal efficiency higher than or equal to those of dust removing devices manufactured by using a lead-containing piezoelectric ceramic.

An image pickup apparatus manufactured by using a lead-free piezoelectric ceramic according to an embodiment of the present invention can have a dust removal function higher than or equal to those of image pickup apparatuses manufactured by using a lead-containing piezoelectric ceramic.

A piezoelectric acoustic component manufactured by using a lead-free piezoelectric ceramic according to an embodiment of the present invention can be used to provide electronic equipment that has sound production ability higher than or equal to those of electronic equipment manufactured by using a lead-containing piezoelectric ceramic.

A piezoelectric ceramic according to an embodiment of the present invention may be used in ultrasonic transducers, piezoelectric actuators, piezoelectric sensors, and ferroelectric memories, as well as liquid discharge heads and motors.

EXAMPLES

Although the present invention is further described in the following examples, the present invention is not limited to these examples.

A piezoelectric ceramic according to an example of the present invention was manufactured as described below.
Piezoelectric Ceramic Example 1

A composition $(Ba_{0.880}Ca_{0.120})_{1.0111}(Ti_{0.970}Sn_{0.030})O_3$ was weighed as described below. This composition is represented by the general formula $(Ba_{1-x}Ca_x)_a(Ti_{1-y-z}Sn_yZr_z)O_3$, wherein $x=0.120$, $y=0.030$, $z=0$, and $a=1.0111$.

Barium titanate, calcium titanate, and barium stannate were weighed such that Ba, Ca, Ti, and Sn satisfied the composition $(Ba_{0.880}Ca_{0.120})_{1.0111}(Ti_{0.970}Sn_{0.030})O_3$. The value a representing the ratio of the number of moles of Ba and Ca at the A site to the number of moles of Ti and Sn at the B site was controlled with barium oxalate and calcium oxalate.

Manganese dioxide was weighed such that the b mol of the first auxiliary component Mn was 0.0121 mol per mole of the composition $(Ba_{0.880}Ca_{0.120})_{1.0111}(Ti_{0.970}Sn_{0.030})O_3$.

These weighed powders were dry-blended in a ball mill for 24 hours. Three parts by weight of a PVA binder was deposited on the surface of 100 parts by weight of the mixed powder with a spray drier.

The resulting granulated powder was charged in a mold and was pressed at 200 MPa with a pressing machine to form a discoidal compact. This compact may be further pressed with a cold isostatic pressing machine.

The compact was held in an electric furnace at a maximum temperature $T_{max}$ of 1250° C. for 5 hours and was sintered in the atmosphere for 24 hours in total.

The average equivalent circular diameter of the crystal grains, the percentage by number of crystal grains having an equivalent circular diameter of 25 μm or less (hereinafter referred to as $D_{25}$), and the relative density of the resulting ceramic were measured. The average equivalent circular diameter was 1.92 μm, $D_{25}$ was 99.7%, and the relative density was 97.0%. The crystal grain was observed mainly with a polarizing microscope. A small crystal grain size was determined with a scanning electron microscope (SEM). Photographic images taken with the polarizing microscope and the scanning electron microscope were processed to determine the average equivalent circular diameter and $D_{25}$. The relative density was measurement in accordance with Archimedes' principle.

The ceramic was polished to a thickness of 0.5 mm, and its crystal structure was analyzed by X-ray diffraction. Only peaks corresponding to a perovskite structure were observed.

The composition of the ceramic was determined by X-ray fluorescence spectroscopy. The spectroscopy showed that the Mn content was 0.0121 mol per mole of a composition having the chemical formula of $(Ba_{0.880}Ca_{0.120})_{1.0111}(Ti_{0.970}Sn_{0.030})O_3$. This indicates that the weighed composition agrees with the composition after sintering. The amounts of elements other than Ba, Ca, Ti, Sn, and Mn were less than the detection limit or less than 0.0001 parts by weight.

The crystal grains were again observed. The average equivalent circular diameter was not significantly changed by polishing.

Examples 2 to 47 and Examples 100 to 112

Piezoelectric ceramics according to Examples 2 to 47 and Examples 100 to 112 were manufactured in the same manner as in Example 1 except that the ratios of main components and the first auxiliary component and the maximum sintering temperature $T_{max}$ were changed as shown in Table 1. In addition to the raw materials used in Example 1, barium zirconate was used as a Zr raw material.

TABLE 1

| | Main component | | | | | | First auxiliary component | | Maximum temperature |
|---|---|---|---|---|---|---|---|---|---|
| | Ba 1 − x | Ca x | Ti 1 − y − z | Sn y | Zr z | A/B a | Mn b | a − b | Tmax [° C.] |
| Example 1 | 0.880 | 0.120 | 0.970 | 0.030 | 0 | 1.0111 | 0.0121 | 0.999 | 1250 |
| Example 2 | 0.920 | 0.080 | 0.960 | 0.040 | 0 | 1.0111 | 0.0121 | 0.999 | 1250 |
| Example 3 | 0.860 | 0.140 | 0.960 | 0.040 | 0 | 1.0111 | 0.0121 | 0.999 | 1250 |
| Example 4 | 0.800 | 0.200 | 0.960 | 0.040 | 0 | 1.0111 | 0.0121 | 0.999 | 1250 |
| Example 5 | 0.910 | 0.090 | 0.965 | 0.035 | 0 | 1.0111 | 0.0121 | 0.999 | 1250 |
| Example 6 | 0.810 | 0.190 | 0.965 | 0.035 | 0 | 1.0111 | 0.0121 | 0.999 | 1250 |
| Example 7 | 0.900 | 0.100 | 0.970 | 0.030 | 0 | 1.0111 | 0.0121 | 0.999 | 1250 |
| Example 8 | 0.850 | 0.150 | 0.970 | 0.030 | 0 | 1.0111 | 0.0121 | 0.999 | 1250 |
| Example 9 | 0.900 | 0.100 | 0.980 | 0.020 | 0 | 1.0111 | 0.0121 | 0.999 | 1250 |
| Example 10 | 0.850 | 0.150 | 0.980 | 0.020 | 0 | 1.0111 | 0.0121 | 0.999 | 1250 |
| Example 11 | 0.910 | 0.090 | 0.985 | 0.015 | 0 | 1.0111 | 0.0121 | 0.999 | 1250 |
| Example 12 | 0.810 | 0.190 | 0.985 | 0.015 | 0 | 1.0111 | 0.0121 | 0.999 | 1250 |
| Example 13 | 0.920 | 0.080 | 0.990 | 0.010 | 0 | 1.0111 | 0.0121 | 0.999 | 1250 |
| Example 14 | 0.800 | 0.200 | 0.990 | 0.010 | 0 | 1.0111 | 0.0121 | 0.999 | 1250 |
| Example 15 | 0.920 | 0.080 | 0.930 | 0.040 | 0.030 | 1.0111 | 0.0121 | 0.999 | 1300 |
| Example 16 | 0.800 | 0.200 | 0.930 | 0.040 | 0.030 | 1.0111 | 0.0121 | 0.999 | 1300 |
| Example 17 | 0.910 | 0.090 | 0.935 | 0.035 | 0.030 | 1.0111 | 0.0121 | 0.999 | 1300 |
| Example 18 | 0.810 | 0.190 | 0.935 | 0.035 | 0.030 | 1.0111 | 0.0121 | 0.999 | 1300 |
| Example 19 | 0.900 | 0.100 | 0.940 | 0.030 | 0.030 | 1.0111 | 0.0121 | 0.999 | 1300 |
| Example 20 | 0.880 | 0.120 | 0.940 | 0.030 | 0.030 | 1.0111 | 0.0121 | 0.999 | 1300 |
| Example 21 | 0.850 | 0.150 | 0.940 | 0.030 | 0.030 | 1.0111 | 0.0121 | 0.999 | 1300 |
| Example 22 | 0.900 | 0.100 | 0.950 | 0.020 | 0.030 | 1.0111 | 0.0121 | 0.999 | 1300 |
| Example 23 | 0.850 | 0.150 | 0.950 | 0.020 | 0.030 | 1.0111 | 0.0121 | 0.999 | 1300 |

TABLE 1-continued

|  | Main component | | | | | | First auxiliary component | | Maximum temperature |
| --- | --- | --- | --- | --- | --- | --- | --- | --- | --- |
|  | Ba 1 − x | Ca x | Ti 1 − y − z | Sn y | Zr z | A/B a | Mn b | a − b | Tmax [° C.] |
| Example 24 | 0.910 | 0.090 | 0.955 | 0.015 | 0.030 | 1.0111 | 0.0121 | 0.999 | 1300 |
| Example 25 | 0.810 | 0.190 | 0.955 | 0.015 | 0.030 | 1.0111 | 0.0121 | 0.999 | 1300 |
| Example 26 | 0.920 | 0.080 | 0.960 | 0.010 | 0.030 | 1.0111 | 0.0121 | 0.999 | 1300 |
| Example 27 | 0.800 | 0.200 | 0.960 | 0.010 | 0.030 | 1.0111 | 0.0121 | 0.999 | 1300 |
| Example 28 | 0.920 | 0.080 | 0.920 | 0.040 | 0.040 | 1.0111 | 0.0121 | 0.999 | 1300 |
| Example 29 | 0.800 | 0.200 | 0.920 | 0.040 | 0.040 | 1.0111 | 0.0121 | 0.999 | 1300 |
| Example 30 | 0.910 | 0.090 | 0.925 | 0.035 | 0.040 | 1.0111 | 0.0121 | 0.999 | 1300 |
| Example 31 | 0.810 | 0.190 | 0.925 | 0.035 | 0.040 | 1.0111 | 0.0121 | 0.999 | 1300 |
| Example 32 | 0.900 | 0.100 | 0.930 | 0.030 | 0.040 | 1.0111 | 0.0121 | 0.999 | 1300 |
| Example 33 | 0.880 | 0.120 | 0.930 | 0.030 | 0.040 | 1.0111 | 0.0121 | 0.999 | 1300 |
| Example 34 | 0.850 | 0.150 | 0.930 | 0.030 | 0.040 | 1.0111 | 0.0121 | 0.999 | 1300 |
| Example 35 | 0.900 | 0.100 | 0.940 | 0.020 | 0.040 | 1.0111 | 0.0121 | 0.999 | 1300 |
| Example 36 | 0.850 | 0.150 | 0.940 | 0.020 | 0.040 | 1.0111 | 0.0121 | 0.999 | 1300 |
| Example 37 | 0.910 | 0.090 | 0.945 | 0.015 | 0.040 | 1.0111 | 0.0121 | 0.999 | 1300 |
| Example 38 | 0.810 | 0.190 | 0.945 | 0.015 | 0.040 | 1.0111 | 0.0121 | 0.999 | 1300 |
| Example 39 | 0.920 | 0.080 | 0.950 | 0.010 | 0.040 | 1.0111 | 0.0121 | 0.999 | 1300 |
| Example 40 | 0.800 | 0.200 | 0.950 | 0.010 | 0.040 | 1.0111 | 0.0121 | 0.999 | 1300 |
| Example 41 | 0.800 | 0.200 | 0.990 | 0.010 | 0 | 1.0111 | 0.0121 | 0.999 | 1450 |
| Example 42 | 0.800 | 0.200 | 0.990 | 0.010 | 0 | 1.0111 | 0.0121 | 0.999 | 1400 |
| Example 43 | 0.800 | 0.200 | 0.990 | 0.010 | 0 | 1.0111 | 0.0121 | 0.999 | 1350 |
| Example 44 | 0.880 | 0.120 | 0.970 | 0.030 | 0 | 1.0046 | 0.0121 | 0.9925 | 1250 |
| Example 45 | 0.880 | 0.120 | 0.970 | 0.030 | 0 | 1.0146 | 0.0121 | 1.0025 | 1250 |
| Example 46 | 0.880 | 0.120 | 0.970 | 0.030 | 0 | 1.0038 | 0.0048 | 0.999 | 1250 |
| Example 47 | 0.880 | 0.120 | 0.970 | 0.030 | 0 | 1.0390 | 0.0400 | 0.999 | 1250 |
| Comparative example 1 | 0.950 | 0.050 | 0.930 | 0.070 | 0 | 1.0111 | 0.0121 | 0.999 | 1300 |
| Comparative example 2 | 0.750 | 0.250 | 0.930 | 0.070 | 0 | 1.0111 | 0.0121 | 0.999 | 1300 |
| Comparative example 3 | 0.950 | 0.050 | 0.960 | 0.040 | 0 | 1.0111 | 0.0121 | 0.999 | 1300 |
| Comparative example 4 | 0.750 | 0.250 | 0.990 | 0.010 | 0 | 1.0111 | 0.0121 | 0.999 | 1300 |
| Comparative example 5 | 0.950 | 0.050 | 0.995 | 0.005 | 0 | 1.0111 | 0.0121 | 0.999 | 1300 |
| Comparative example 6 | 0.750 | 0.250 | 0.995 | 0.005 | 0 | 1.0111 | 0.0121 | 0.999 | 1300 |
| Comparative example 7 | 0.950 | 0.050 | 0.900 | 0.070 | 0.030 | 1.0111 | 0.0121 | 0.999 | 1300 |
| Comparative example 8 | 0.750 | 0.250 | 0.900 | 0.070 | 0.030 | 1.0111 | 0.0121 | 0.999 | 1300 |
| Comparative example 9 | 0.950 | 0.050 | 0.930 | 0.040 | 0.030 | 1.0111 | 0.0121 | 0.999 | 1300 |
| Comparative example 10 | 0.750 | 0.250 | 0.960 | 0.010 | 0.030 | 1.0111 | 0.0121 | 0.999 | 1300 |
| Comparative example 11 | 0.950 | 0.050 | 0.965 | 0.005 | 0.030 | 1.0111 | 0.0121 | 0.999 | 1300 |
| Comparative example 12 | 0.750 | 0.250 | 0.965 | 0.005 | 0.030 | 1.0111 | 0.0121 | 0.999 | 1300 |
| Comparative example 13 | 0.950 | 0.050 | 0.890 | 0.070 | 0.040 | 1.0111 | 0.0121 | 0.999 | 1300 |
| Comparative example 14 | 0.750 | 0.250 | 0.890 | 0.070 | 0.040 | 1.0111 | 0.0121 | 0.999 | 1300 |
| Comparative example 15 | 0.950 | 0.050 | 0.920 | 0.040 | 0.040 | 1.0111 | 0.0121 | 0.999 | 1300 |
| Comparative example 16 | 0.750 | 0.250 | 0.950 | 0.010 | 0.040 | 1.0111 | 0.0121 | 0.999 | 1300 |
| Comparative example 17 | 0.950 | 0.050 | 0.955 | 0.005 | 0.040 | 1.0111 | 0.0121 | 0.999 | 1300 |
| Comparative example 18 | 0.750 | 0.250 | 0.955 | 0.005 | 0.040 | 1.0111 | 0.0121 | 0.999 | 1300 |
| Comparative example 19 | 0.990 | 0.010 | 0.910 | 0.040 | 0.050 | 1.0111 | 0.0121 | 0.999 | 1300 |
| Comparative example 20 | 0.880 | 0.120 | 0.970 | 0.030 | 0 | 1.0031 | 0.0121 | 0.991 | 1300 |
| Comparative example 21 | 0.880 | 0.120 | 0.970 | 0.030 | 0 | 1.0161 | 0.0121 | 1.004 | 1300 |
| Comparative example 22 | 0.880 | 0.120 | 0.970 | 0.030 | 0 | 1.0020 | 0.0030 | 0.999 | 1300 |
| Comparative example 23 | 0.880 | 0.120 | 0.970 | 0.030 | 0 | 1.0440 | 0.0450 | 0.999 | 1300 |
| Example 100 | 0.920 | 0.080 | 0.950 | 0.040 | 0.010 | 1.01111 | 0.0121 | 0.999 | 1280 |
| Example 101 | 0.800 | 0.200 | 0.950 | 0.040 | 0.010 | 1.01111 | 0.0121 | 0.999 | 1280 |
| Example 102 | 0.910 | 0.090 | 0.955 | 0.035 | 0.010 | 1.01111 | 0.0121 | 0.999 | 1280 |
| Example 103 | 0.810 | 0.190 | 0.955 | 0.035 | 0.010 | 1.01111 | 0.0121 | 0.999 | 1280 |
| Example 104 | 0.900 | 0.100 | 0.960 | 0.030 | 0.010 | 1.01111 | 0.0121 | 0.999 | 1280 |
| Example 105 | 0.880 | 0.120 | 0.960 | 0.030 | 0.010 | 1.01111 | 0.0121 | 0.999 | 1280 |
| Example 106 | 0.850 | 0.150 | 0.960 | 0.030 | 0.010 | 1.01111 | 0.0121 | 0.999 | 1280 |
| Example 107 | 0.900 | 0.100 | 0.970 | 0.020 | 0.010 | 1.01111 | 0.0121 | 0.999 | 1280 |
| Example 108 | 0.850 | 0.150 | 0.970 | 0.020 | 0.010 | 1.01111 | 0.0121 | 0.999 | 1280 |
| Example 109 | 0.910 | 0.090 | 0.975 | 0.015 | 0.010 | 1.01111 | 0.0121 | 0.999 | 1280 |
| Example 110 | 0.810 | 0.190 | 0.975 | 0.015 | 0.010 | 1.01111 | 0.0121 | 0.999 | 1280 |
| Example 111 | 0.920 | 0.080 | 0.980 | 0.010 | 0.010 | 1.01111 | 0.0121 | 0.999 | 1280 |
| Example 112 | 0.800 | 0.200 | 0.980 | 0.010 | 0.010 | 1.01111 | 0.0121 | 0.999 | 1280 |
| Comparative Example 100 | 0.950 | 0.050 | 0.920 | 0.070 | 0.010 | 1.01111 | 0.0121 | 0.999 | 1280 |
| Comparative Example 101 | 0.750 | 0.250 | 0.920 | 0.070 | 0.010 | 1.01111 | 0.0121 | 0.999 | 1280 |
| Comparative Example 102 | 0.950 | 0.050 | 0.950 | 0.040 | 0.010 | 1.01111 | 0.0121 | 0.999 | 1280 |
| Comparative Example 103 | 0.750 | 0.250 | 0.980 | 0.010 | 0.010 | 1.01111 | 0.0121 | 0.999 | 1280 |
| Comparative Example 104 | 0.950 | 0.050 | 0.985 | 0.005 | 0.010 | 1.01111 | 0.0121 | 0.999 | 1280 |
| Comparative Example 105 | 0.750 | 0.250 | 0.985 | 0.005 | 0.010 | 1.01111 | 0.0121 | 0.999 | 1280 |

The average equivalent circular diameter, $D_{25}$, and the relative density were determined in the same manner as in Example 1. Table 2 shows the results.

TABLE 2

|  | Average equivalent circular diameter [μm] | $D_{25}$ [%] | Relative density [%] |
|---|---|---|---|
| Example 1 | 1.92 | 99.7 | 97.0 |
| Example 2 | 2.00 | 99.8 | 92.8 |
| Example 3 | 3.60 | 99.7 | 92.6 |
| Example 4 | 3.05 | 100.0 | 91.5 |
| Example 5 | 2.03 | 99.6 | 93.0 |
| Example 6 | 1.84 | 99.6 | 93.1 |
| Example 7 | 1.15 | 99.7 | 96.3 |
| Example 8 | 2.11 | 99.6 | 95.0 |
| Example 9 | 1.96 | 99.7 | 97.5 |
| Example 10 | 1.89 | 100.0 | 96.0 |
| Example 11 | 3.04 | 99.5 | 94.1 |
| Example 12 | 2.56 | 99.9 | 94.0 |
| Example 13 | 2.35 | 99.5 | 92.1 |
| Example 14 | 1.85 | 99.6 | 91.4 |
| Example 15 | 1.10 | 99.7 | 91.0 |
| Example 16 | 1.23 | 99.8 | 91.6 |
| Example 17 | 2.24 | 99.6 | 93.1 |
| Example 18 | 1.46 | 99.5 | 94.2 |
| Example 19 | 1.99 | 99.8 | 95.4 |
| Example 20 | 2.13 | 99.7 | 95.5 |
| Example 21 | 1.83 | 99.6 | 96.1 |
| Example 22 | 2.21 | 99.8 | 97.2 |
| Example 23 | 2.04 | 99.3 | 96.3 |
| Example 24 | 3.45 | 99.7 | 94.6 |
| Example 25 | 3.16 | 99.8 | 93.4 |
| Example 26 | 2.22 | 99.9 | 92.3 |
| Example 27 | 3.56 | 99.5 | 90.9 |
| Example 28 | 3.05 | 99.6 | 91.4 |
| Example 29 | 3.41 | 99.8 | 91.5 |
| Example 30 | 2.58 | 99.9 | 93.1 |
| Example 31 | 2.14 | 99.7 | 94.2 |
| Example 32 | 2.15 | 99.8 | 96.2 |
| Example 33 | 1.99 | 99.5 | 96.7 |
| Example 34 | 2.32 | 99.6 | 97.0 |
| Example 35 | 1.93 | 99.8 | 97.1 |
| Example 36 | 2.01 | 99.9 | 96.6 |
| Example 37 | 3.13 | 99.8 | 93.6 |
| Example 38 | 3.08 | 99.7 | 93.3 |
| Example 39 | 3.11 | 99.6 | 91.0 |
| Example 40 | 3.45 | 99.9 | 91.2 |
| Example 41 | 15.60 | 86.7 | 89.5 |
| Example 42 | 9.98 | 99.0 | 90.2 |
| Example 43 | 4.60 | 99.4 | 92.4 |
| Example 44 | 3.60 | 99.7 | 95.5 |
| Example 45 | 1.53 | 99.6 | 96.0 |
| Example 46 | 2.31 | 99.7 | 96.3 |
| Example 47 | 2.40 | 99.8 | 95.7 |

TABLE 2-continued

|  | Average equivalent circular diameter [μm] | $D_{25}$ [%] | Relative density [%] |
|---|---|---|---|
| Comparative example 1 | 1.31 | 99.1 | 94.6 |
| Comparative example 2 | 1.23 | 99.2 | 93.7 |
| Comparative example 3 | 1.56 | 99.3 | 91.5 |
| Comparative example 4 | 1.42 | 99.2 | 92.0 |
| Comparative example 5 | 1.27 | 99.4 | 93.4 |
| Comparative example 6 | 1.22 | 99.3 | 92.3 |
| Comparative example 7 | 1.42 | 99.4 | 91.0 |
| Comparative example 8 | 1.34 | 99.3 | 90.5 |
| Comparative example 9 | 1.29 | 99.2 | 93.2 |
| Comparative example 10 | 1.31 | 99.3 | 91.2 |
| Comparative example 11 | 1.12 | 99.1 | 90.1 |
| Comparative example 12 | 1.36 | 99.2 | 90.8 |
| Comparative example 13 | 1.25 | 99.2 | 91.3 |
| Comparative example 14 | 1.28 | 99.2 | 90.3 |
| Comparative example 15 | 1.14 | 99.0 | 92.0 |
| Comparative example 16 | 0.95 | 99.4 | 90.6 |
| Comparative example 17 | 0.94 | 99.4 | 92.3 |
| Comparative example 18 | 1.06 | 99.1 | 91.9 |
| Comparative example 19 | 0.86 | 99.4 | 78.6 |
| Comparative example 20 | 18.60 | 76.8 | 91.2 |
| Comparative example 21 | 0.87 | 99.1 | 78.9 |
| Comparative example 22 | 1.24 | 99.4 | 93.5 |
| Comparative example 23 | 5.64 | 99.0 | 91.6 |
| Example 100 | 1.12 | 99.8 | 91.2 |
| Example 101 | 1.20 | 99.9 | 91.4 |
| Example 102 | 2.20 | 99.6 | 93.4 |
| Example 103 | 1.51 | 99.6 | 94.0 |
| Example 104 | 1.89 | 99.7 | 95.5 |
| Example 105 | 2.10 | 99.7 | 95.5 |
| Example 106 | 1.74 | 99.8 | 96.4 |
| Example 107 | 2.30 | 99.6 | 97.6 |
| Example 108 | 2.00 | 99.4 | 96.2 |
| Example 109 | 3.52 | 99.8 | 94.2 |
| Example 110 | 3.06 | 99.9 | 93.3 |
| Example 111 | 2.13 | 99.9 | 92.2 |
| Example 112 | 3.55 | 99.6 | 91.0 |
| Comparative Example 100 | 1.40 | 99.9 | 91.3 |
| Comparative Example 101 | 1.38 | 100.0 | 90.4 |
| Comparative Example 102 | 1.25 | 99.4 | 93.4 |
| Comparative Example 103 | 1.33 | 99.3 | 90.9 |
| Comparative Example 104 | 1.11 | 99.0 | 90.7 |
| Comparative Example 105 | 1.34 | 99.4 | 90.1 |

The composition analysis was performed in the same manner as in Example 1. Table 3 shows the results. The third auxiliary component in the table is an element other than Ba, Ca, Ti, Zr, Sn, and Mn. In the following table, zero indicates less than the detection limit or less than 0.0001 parts by weight. Table 3 shows that the weighed composition in all the samples agreed with the composition after sintering.

TABLE 3

|  | Main component | | | | | | First auxiliary component | | | Third |
|---|---|---|---|---|---|---|---|---|---|---|
|  | Ba $1-x$ | Ca $x$ | Ti $1-y-z$ | Sn $y$ | Zr $z$ | A/B $a$ | Mn $b$ | $a-b$ | auxiliary component |
| Example 1 | 0.880 | 0.120 | 0.970 | 0.030 | 0.000 | 1.0111 | 0.0121 | 0.999 | 0.000 |
| Example 2 | 0.920 | 0.080 | 0.960 | 0.040 | 0.000 | 1.0111 | 0.0121 | 0.999 | 0.000 |
| Example 3 | 0.860 | 0.140 | 0.960 | 0.040 | 0.000 | 1.0111 | 0.0121 | 0.999 | 0.000 |
| Example 4 | 0.800 | 0.200 | 0.960 | 0.040 | 0.000 | 1.0111 | 0.0121 | 0.999 | 0.000 |
| Example 5 | 0.910 | 0.090 | 0.965 | 0.035 | 0.000 | 1.0111 | 0.0121 | 0.999 | 0.000 |
| Example 6 | 0.810 | 0.190 | 0.965 | 0.035 | 0.000 | 1.0111 | 0.0121 | 0.999 | 0.000 |
| Example 7 | 0.900 | 0.100 | 0.970 | 0.030 | 0.000 | 1.0111 | 0.0121 | 0.999 | 0.000 |
| Example 8 | 0.850 | 0.150 | 0.970 | 0.030 | 0.000 | 1.0111 | 0.0121 | 0.999 | 0.000 |
| Example 9 | 0.900 | 0.100 | 0.980 | 0.020 | 0.000 | 1.0111 | 0.0121 | 0.999 | 0.000 |
| Example 10 | 0.850 | 0.150 | 0.980 | 0.020 | 0.000 | 1.0111 | 0.0121 | 0.999 | 0.000 |
| Example 11 | 0.910 | 0.090 | 0.985 | 0.015 | 0.000 | 1.0111 | 0.0121 | 0.999 | 0.000 |
| Example 12 | 0.810 | 0.190 | 0.985 | 0.015 | 0.000 | 1.0111 | 0.0121 | 0.999 | 0.000 |
| Example 13 | 0.920 | 0.080 | 0.990 | 0.010 | 0.000 | 1.0111 | 0.0121 | 0.999 | 0.000 |
| Example 14 | 0.800 | 0.200 | 0.990 | 0.010 | 0.000 | 1.0111 | 0.0121 | 0.999 | 0.000 |

TABLE 3-continued

|  | Main component | | | | | | First auxiliary component | | Third auxiliary component |
| --- | --- | --- | --- | --- | --- | --- | --- | --- | --- |
|  | Ba 1 − x | Ca x | Ti 1 − y − z | Sn y | Zr z | A/B a | Mn b | a − b |  |
| Example 15 | 0.920 | 0.080 | 0.930 | 0.040 | 0.030 | 1.0111 | 0.0121 | 0.999 | 0.000 |
| Example 16 | 0.800 | 0.200 | 0.930 | 0.040 | 0.030 | 1.0111 | 0.0121 | 0.999 | 0.000 |
| Example 17 | 0.910 | 0.090 | 0.935 | 0.035 | 0.030 | 1.0111 | 0.0121 | 0.999 | 0.000 |
| Example 18 | 0.810 | 0.190 | 0.935 | 0.035 | 0.030 | 1.0111 | 0.0121 | 0.999 | 0.000 |
| Example 19 | 0.900 | 0.100 | 0.940 | 0.030 | 0.030 | 1.0111 | 0.0121 | 0.999 | 0.000 |
| Example 20 | 0.880 | 0.120 | 0.940 | 0.030 | 0.030 | 1.0111 | 0.0121 | 0.999 | 0.000 |
| Example 21 | 0.850 | 0.150 | 0.940 | 0.030 | 0.030 | 1.0111 | 0.0121 | 0.999 | 0.000 |
| Example 22 | 0.900 | 0.100 | 0.950 | 0.020 | 0.030 | 1.0111 | 0.0121 | 0.999 | 0.000 |
| Example 23 | 0.850 | 0.150 | 0.950 | 0.020 | 0.030 | 1.0111 | 0.0121 | 0.999 | 0.000 |
| Example 24 | 0.910 | 0.090 | 0.955 | 0.015 | 0.030 | 1.0111 | 0.0121 | 0.999 | 0.000 |
| Example 25 | 0.810 | 0.190 | 0.955 | 0.015 | 0.030 | 1.0111 | 0.0121 | 0.999 | 0.000 |
| Example 26 | 0.920 | 0.080 | 0.960 | 0.010 | 0.030 | 1.0111 | 0.0121 | 0.999 | 0.000 |
| Example 27 | 0.800 | 0.200 | 0.960 | 0.010 | 0.030 | 1.0111 | 0.0121 | 0.999 | 0.000 |
| Example 28 | 0.920 | 0.080 | 0.920 | 0.040 | 0.040 | 1.0111 | 0.0121 | 0.999 | 0.000 |
| Example 29 | 0.800 | 0.200 | 0.920 | 0.040 | 0.040 | 1.0111 | 0.0121 | 0.999 | 0.000 |
| Example 30 | 0.910 | 0.090 | 0.925 | 0.035 | 0.040 | 1.0111 | 0.0121 | 0.999 | 0.000 |
| Example 31 | 0.810 | 0.190 | 0.925 | 0.035 | 0.040 | 1.0111 | 0.0121 | 0.999 | 0.000 |
| Example 32 | 0.900 | 0.100 | 0.930 | 0.030 | 0.040 | 1.0111 | 0.0121 | 0.999 | 0.000 |
| Example 33 | 0.880 | 0.120 | 0.930 | 0.030 | 0.040 | 1.0111 | 0.0121 | 0.999 | 0.000 |
| Example 34 | 0.850 | 0.150 | 0.930 | 0.030 | 0.040 | 1.0111 | 0.0121 | 0.999 | 0.000 |
| Example 35 | 0.900 | 0.100 | 0.940 | 0.020 | 0.040 | 1.0111 | 0.0121 | 0.999 | 0.000 |
| Example 36 | 0.850 | 0.150 | 0.940 | 0.020 | 0.040 | 1.0111 | 0.0121 | 0.999 | 0.000 |
| Example 37 | 0.910 | 0.090 | 0.945 | 0.015 | 0.040 | 1.0111 | 0.0121 | 0.999 | 0.000 |
| Example 38 | 0.810 | 0.190 | 0.945 | 0.015 | 0.040 | 1.0111 | 0.0121 | 0.999 | 0.000 |
| Example 39 | 0.920 | 0.080 | 0.950 | 0.010 | 0.040 | 1.0111 | 0.0121 | 0.999 | 0.000 |
| Example 40 | 0.800 | 0.200 | 0.950 | 0.010 | 0.040 | 1.0111 | 0.0121 | 0.999 | 0.000 |
| Example 41 | 0.800 | 0.200 | 0.990 | 0.010 | 0.000 | 1.0111 | 0.0121 | 0.999 | 0.000 |
| Example 42 | 0.800 | 0.200 | 0.990 | 0.010 | 0.000 | 1.0111 | 0.0121 | 0.999 | 0.000 |
| Example 43 | 0.800 | 0.200 | 0.990 | 0.010 | 0.000 | 1.0111 | 0.0121 | 0.999 | 0.000 |
| Example 44 | 0.880 | 0.120 | 0.970 | 0.030 | 0.000 | 1.0046 | 0.0121 | 0.9925 | 0.000 |
| Example 45 | 0.880 | 0.120 | 0.970 | 0.030 | 0.000 | 1.0146 | 0.0121 | 1.0025 | 0.000 |
| Example 46 | 0.880 | 0.120 | 0.970 | 0.030 | 0.000 | 1.0038 | 0.0048 | 0.999 | 0.000 |
| Example 47 | 0.880 | 0.120 | 0.970 | 0.030 | 0.000 | 1.0390 | 0.0400 | 0.999 | 0.000 |
| Comparative example 1 | 0.950 | 0.050 | 0.930 | 0.070 | 0.000 | 1.0111 | 0.0121 | 0.999 | 0.000 |
| Comparative example 2 | 0.750 | 0.250 | 0.930 | 0.070 | 0.000 | 1.0111 | 0.0121 | 0.999 | 0.000 |
| Comparative example 3 | 0.950 | 0.050 | 0.960 | 0.040 | 0.000 | 1.0111 | 0.0121 | 0.999 | 0.000 |
| Comparative example 4 | 0.750 | 0.250 | 0.990 | 0.010 | 0.000 | 1.0111 | 0.0121 | 0.999 | 0.000 |
| Comparative example 5 | 0.950 | 0.050 | 0.995 | 0.005 | 0.000 | 1.0111 | 0.0121 | 0.999 | 0.000 |
| Comparative example 6 | 0.750 | 0.250 | 0.995 | 0.005 | 0.000 | 1.0111 | 0.0121 | 0.999 | 0.000 |
| Comparative example 7 | 0.950 | 0.050 | 0.900 | 0.070 | 0.030 | 1.0111 | 0.0121 | 0.999 | 0.000 |
| Comparative example 8 | 0.750 | 0.250 | 0.900 | 0.070 | 0.030 | 1.0111 | 0.0121 | 0.999 | 0.000 |
| Comparative example 9 | 0.950 | 0.050 | 0.930 | 0.040 | 0.030 | 1.0111 | 0.0121 | 0.999 | 0.000 |
| Comparative example 10 | 0.750 | 0.250 | 0.960 | 0.010 | 0.030 | 1.0111 | 0.0121 | 0.999 | 0.000 |
| Comparative example 11 | 0.950 | 0.050 | 0.965 | 0.005 | 0.030 | 1.0111 | 0.0121 | 0.999 | 0.000 |
| Comparative example 12 | 0.750 | 0.250 | 0.965 | 0.005 | 0.030 | 1.0111 | 0.0121 | 0.999 | 0.000 |
| Comparative example 13 | 0.950 | 0.050 | 0.890 | 0.070 | 0.040 | 1.0111 | 0.0121 | 0.999 | 0.000 |
| Comparative example 14 | 0.750 | 0.250 | 0.890 | 0.070 | 0.040 | 1.0111 | 0.0121 | 0.999 | 0.000 |
| Comparative example 15 | 0.950 | 0.050 | 0.920 | 0.040 | 0.040 | 1.0111 | 0.0121 | 0.999 | 0.000 |
| Comparative example 16 | 0.750 | 0.250 | 0.950 | 0.010 | 0.040 | 1.0111 | 0.0121 | 0.999 | 0.000 |
| Comparative example 17 | 0.950 | 0.050 | 0.955 | 0.005 | 0.040 | 1.0111 | 0.0121 | 0.999 | 0.000 |
| Comparative example 18 | 0.750 | 0.250 | 0.955 | 0.005 | 0.040 | 1.0111 | 0.0121 | 0.999 | 0.000 |
| Comparative example 19 | 0.990 | 0.010 | 0.910 | 0.040 | 0.050 | 1.0111 | 0.0121 | 0.999 | 0.000 |
| Comparative example 20 | 0.880 | 0.120 | 0.970 | 0.030 | 0.000 | 1.0031 | 0.0121 | 0.991 | 0.000 |
| Comparative example 21 | 0.880 | 0.120 | 0.970 | 0.030 | 0.000 | 1.0161 | 0.0121 | 1.004 | 0.000 |
| Comparative example 22 | 0.880 | 0.120 | 0.970 | 0.030 | 0.000 | 1.0020 | 0.0030 | 0.999 | 0.000 |
| Comparative example 23 | 0.880 | 0.120 | 0.970 | 0.030 | 0.000 | 1.0440 | 0.0450 | 0.999 | 0.000 |
| Example 100 | 0.920 | 0.080 | 0.950 | 0.040 | 0.010 | 1.01111 | 0.0121 | 0.999 | 0.000 |
| Example 101 | 0.800 | 0.200 | 0.950 | 0.040 | 0.010 | 1.01111 | 0.0121 | 0.999 | 0.000 |
| Example 102 | 0.910 | 0.090 | 0.955 | 0.035 | 0.010 | 1.01111 | 0.0121 | 0.999 | 0.000 |
| Example 103 | 0.810 | 0.190 | 0.955 | 0.035 | 0.010 | 1.01111 | 0.0121 | 0.999 | 0.000 |
| Example 104 | 0.900 | 0.100 | 0.960 | 0.030 | 0.010 | 1.01111 | 0.0121 | 0.999 | 0.000 |
| Example 105 | 0.880 | 0.120 | 0.960 | 0.030 | 0.010 | 1.01111 | 0.0121 | 0.999 | 0.000 |
| Example 106 | 0.850 | 0.150 | 0.960 | 0.030 | 0.010 | 1.01111 | 0.0121 | 0.999 | 0.000 |
| Example 107 | 0.900 | 0.100 | 0.970 | 0.020 | 0.010 | 1.01111 | 0.0121 | 0.999 | 0.000 |
| Example 108 | 0.850 | 0.150 | 0.970 | 0.020 | 0.010 | 1.01111 | 0.0121 | 0.999 | 0.000 |
| Example 109 | 0.910 | 0.090 | 0.975 | 0.015 | 0.010 | 1.01111 | 0.0121 | 0.999 | 0.000 |
| Example 110 | 0.810 | 0.190 | 0.975 | 0.015 | 0.010 | 1.01111 | 0.0121 | 0.999 | 0.000 |
| Example 111 | 0.920 | 0.080 | 0.980 | 0.010 | 0.010 | 1.01111 | 0.0121 | 0.999 | 0.000 |
| Example 112 | 0.800 | 0.200 | 0.980 | 0.010 | 0.010 | 1.01111 | 0.0121 | 0.999 | 0.000 |
| Comparative Example 100 | 0.950 | 0.050 | 0.920 | 0.070 | 0.010 | 1.01111 | 0.0121 | 0.999 | 0.000 |
| Comparative Example 101 | 0.750 | 0.250 | 0.920 | 0.070 | 0.010 | 1.01111 | 0.0121 | 0.999 | 0.000 |

TABLE 3-continued

|  | Main component | | | | | | First auxiliary component | | Third |
|---|---|---|---|---|---|---|---|---|---|
|  | Ba 1 − x | Ca x | Ti 1 − y − z | Sn y | Zr z | A/B a | Mn b | a − b | auxiliary component |
| Comparative Example 102 | 0.950 | 0.050 | 0.950 | 0.040 | 0.010 | 1.01111 | 0.0121 | 0.999 | 0.000 |
| Comparative Example 103 | 0.750 | 0.250 | 0.980 | 0.010 | 0.010 | 1.01111 | 0.0121 | 0.999 | 0.000 |
| Comparative Example 104 | 0.950 | 0.050 | 0.985 | 0.005 | 0.010 | 1.01111 | 0.0121 | 0.999 | 0.000 |
| Comparative Example 105 | 0.750 | 0.250 | 0.985 | 0.005 | 0.010 | 1.01111 | 0.0121 | 0.999 | 0.000 |

Comparative Examples 1 to 23 and Comparative Examples 100 to 105

Comparative ceramics were manufactured in the same manner as in Example 1 except that the ratios of main components and the first auxiliary component and the maximum sintering temperature $T_{max}$ were changed as shown in Table 1.

The average equivalent circular diameter and the relative density were determined in the same manner as in Example 1

Table 2 Shows the Results

The composition analysis was performed in the same manner as in Example 1. Table 3 shows the results. The third auxiliary component in the table is an element other than Ba, Ca, Ti, Zr, Sn, and Mn. In the following table, zero indicates less than the detection limit or less than 0.0001 parts by weight. Table 3 shows that the weighed composition in all the samples agreed with the composition after sintering.

Example 48

In the same manner as in Example 1, barium titanate, calcium titanate, barium zirconate, barium stannate, barium oxalate, and calcium oxalate were weighed as main components such that Ba, Ca, Ti, Zr, and Sn satisfied the ratios shown in Table 4. Manganese dioxide was weighed such that the ratio of the first auxiliary component Mn to 1 mol of the main component satisfied the ratio shown in Table 4. Silicon dioxide and boron trioxide were weighed such that the ratios of the second auxiliary components Si and B on a metal basis to 100 parts by weight of the main component satisfied the ratios shown in Table 4. These weighed powders were mixed and granulated in the same manner as in Example 1. The powders were fired at the maximum temperature $T_{max}$ shown in Table 4 in the same manner as in Example 1. The average equivalent circular diameter, $D_{25}$, and the relative density were determined in the same manner as in Example 1. Table 5 shows the results. The composition was determined in the same manner as in Example 1. Table 6 shows the results.

TABLE 4

|  | Main component | | | | | | First auxiliary component | | Second auxiliary component | | | | Maximum temperature |
|---|---|---|---|---|---|---|---|---|---|---|---|---|---|
|  | | | | | | | | | Cu Parts | Si Parts | B Parts | Total Parts | |
|  | Ba 1 − x | Ca x | Ti 1 − y − z | Sn y | Zr z | A/B a | Mn b | a − b | by weight | by weight | by weight | by weight | Tmax [° C.] |
| Example 48 | 0.920 | 0.080 | 0.960 | 0.040 | 0 | 1.0111 | 0.0121 | 0.999 | 0 | 0.0140 | 0.0066 | 0.0206 | 1200 |
| Example 49 | 0.860 | 0.140 | 0.960 | 0.040 | 0 | 1.0111 | 0.0121 | 0.999 | 0 | 0.0140 | 0.0066 | 0.0206 | 1200 |
| Example 50 | 0.800 | 0.200 | 0.960 | 0.040 | 0 | 1.0111 | 0.0121 | 0.999 | 0 | 0.0140 | 0.0066 | 0.0206 | 1200 |
| Example 51 | 0.910 | 0.090 | 0.965 | 0.035 | 0 | 1.0111 | 0.0121 | 0.999 | 0 | 0.0140 | 0.0066 | 0.0206 | 1200 |
| Example 52 | 0.810 | 0.190 | 0.965 | 0.035 | 0 | 1.0111 | 0.0121 | 0.999 | 0 | 0.0140 | 0.0066 | 0.0206 | 1200 |
| Example 53 | 0.900 | 0.100 | 0.970 | 0.030 | 0 | 1.0111 | 0.0121 | 0.999 | 0 | 0.0140 | 0.0066 | 0.0206 | 1200 |
| Example 54 | 0.880 | 0.120 | 0.970 | 0.030 | 0 | 1.0111 | 0.0121 | 0.999 | 0 | 0.0140 | 0.0066 | 0.0206 | 1200 |
| Example 55 | 0.850 | 0.150 | 0.970 | 0.030 | 0 | 1.0111 | 0.0121 | 0.999 | 0 | 0.0140 | 0.0066 | 0.0206 | 1200 |
| Example 56 | 0.900 | 0.100 | 0.980 | 0.020 | 0 | 1.0111 | 0.0121 | 0.999 | 0 | 0.0140 | 0.0066 | 0.0206 | 1200 |
| Example 57 | 0.850 | 0.150 | 0.980 | 0.020 | 0 | 1.0111 | 0.0121 | 0.999 | 0 | 0.0140 | 0.0066 | 0.0206 | 1200 |
| Example 58 | 0.910 | 0.090 | 0.985 | 0.015 | 0 | 1.0111 | 0.0121 | 0.999 | 0 | 0.0140 | 0.0066 | 0.0206 | 1200 |
| Example 59 | 0.810 | 0.190 | 0.985 | 0.015 | 0 | 1.0111 | 0.0121 | 0.999 | 0 | 0.0140 | 0.0066 | 0.0206 | 1200 |
| Example 60 | 0.920 | 0.080 | 0.990 | 0.010 | 0 | 1.0111 | 0.0121 | 0.999 | 0 | 0.0140 | 0.0066 | 0.0206 | 1200 |

TABLE 4-continued

| | Main component | | | | | A/B | First auxiliary component Mn | a − b | Second auxiliary component | | | | Maximum temperature |
| | Ba 1 − x | Ca x | Ti 1 − y − z | Sn y | Zr z | a | b | | Cu Parts by weight | Si Parts by weight | B Parts by weight | Total Parts by weight | Tmax [° C.] |
|---|---|---|---|---|---|---|---|---|---|---|---|---|---|
| Example 61 | 0.800 | 0.200 | 0.990 | 0.010 | 0 | 1.0111 | 0.0121 | 0.999 | 0 | 0.0140 | 0.0066 | 0.0206 | 1200 |
| Example 62 | 0.880 | 0.120 | 0.940 | 0.030 | 0.030 | 1.0111 | 0.0121 | 0.999 | 0 | 0.0140 | 0.0066 | 0.0206 | 1200 |
| Example 63 | 0.880 | 0.120 | 0.930 | 0.030 | 0.040 | 1.0111 | 0.0121 | 0.999 | 0 | 0.0140 | 0.0066 | 0.0206 | 1200 |
| Example 64 | 0.880 | 0.120 | 0.970 | 0.030 | 0 | 1.0111 | 0.0121 | 0.999 | 0.0010 | 0 | 0 | 0.0010 | 1200 |
| Example 65 | 0.880 | 0.120 | 0.970 | 0.030 | 0 | 1.0111 | 0.0121 | 0.999 | 4.0000 | 0 | 0 | 4.0000 | 1200 |
| Example 66 | 0.880 | 0.120 | 0.970 | 0.030 | 0 | 1.0111 | 0.0121 | 0.999 | 0 | 0.0010 | 0 | 0.0010 | 1200 |
| Example 67 | 0.880 | 0.120 | 0.970 | 0.030 | 0 | 1.0111 | 0.0121 | 0.999 | 0 | 4.0000 | 0 | 4.0000 | 1200 |
| Example 68 | 0.880 | 0.120 | 0.970 | 0.030 | 0 | 1.0111 | 0.0121 | 0.999 | 0 | 0 | 0.0010 | 0.0010 | 1200 |
| Example 69 | 0.880 | 0.120 | 0.970 | 0.030 | 0 | 1.0111 | 0.0121 | 0.999 | 0 | 0 | 4.0000 | 4.0000 | 1200 |
| Example 70 | 0.880 | 0.120 | 0.970 | 0.030 | 0 | 1.0111 | 0.0121 | 0.999 | 0 | 0.0005 | 0.0005 | 0.0010 | 1200 |
| Example 71 | 0.880 | 0.120 | 0.970 | 0.030 | 0 | 1.0111 | 0.0121 | 0.999 | 0 | 0.0100 | 0.0066 | 0.0166 | 1200 |
| Example 72 | 0.880 | 0.120 | 0.970 | 0.030 | 0 | 1.0111 | 0.0121 | 0.999 | 0 | 0.0250 | 0.0066 | 0.0316 | 1200 |
| Example 73 | 0.880 | 0.120 | 0.970 | 0.030 | 0 | 1.0111 | 0.0121 | 0.999 | 0 | 0.0300 | 0.0066 | 0.0366 | 1200 |
| Example 74 | 0.880 | 0.120 | 0.970 | 0.030 | 0 | 1.0111 | 0.0121 | 0.999 | 0 | 2.0000 | 2.0000 | 4.0000 | 1200 |
| Example 75 | 0.880 | 0.120 | 0.970 | 0.030 | 0 | 1.0111 | 0.0121 | 0.999 | 0.0005 | 0.0005 | 0 | 0.0010 | 1200 |
| Example 76 | 0.880 | 0.120 | 0.970 | 0.030 | 0 | 1.0111 | 0.0121 | 0.999 | 2.0000 | 2.0000 | 0 | 4.0000 | 1200 |
| Example 77 | 0.880 | 0.120 | 0.970 | 0.030 | 0 | 1.0111 | 0.0121 | 0.999 | 0.0005 | 0 | 0.0005 | 0.0010 | 1200 |
| Example 78 | 0.880 | 0.120 | 0.970 | 0.030 | 0 | 1.0111 | 0.0121 | 0.999 | 2.0000 | 0 | 2.0000 | 4.0000 | 1200 |
| Example 79 | 0.880 | 0.120 | 0.970 | 0.030 | 0 | 1.0111 | 0.0121 | 0.999 | 0.0034 | 0.0034 | 0.0034 | 0.0102 | 1200 |
| Example 80 | 0.880 | 0.120 | 0.970 | 0.030 | 0 | 1.0111 | 0.0121 | 0.999 | 1.3000 | 1.3000 | 1.3000 | 3.9000 | 1200 |
| Example 113 | 0.880 | 0.120 | 0.960 | 0.030 | 0.010 | 1.0111 | 0.0121 | 0.999 | 0.0000 | 0.0140 | 0.0066 | 0.0206 | 1200 |
| Example 114 | 0.880 | 0.120 | 0.960 | 0.030 | 0.010 | 1.0111 | 0.0121 | 0.999 | 0.0034 | 0.0034 | 0.0034 | 0.0102 | 1200 |
| Example 115 | 0.880 | 0.120 | 0.960 | 0.030 | 0.010 | 1.0111 | 0.0121 | 0.999 | 1.3000 | 1.3000 | 1.3000 | 3.9000 | 1200 |

TABLE 5

| | Average equivalent circular diameter [μm] | $D_{25}$ [%] | Relative density [%] |
|---|---|---|---|
| Example 48 | 1.46 | 99.9 | 92.9 |
| Example 49 | 1.57 | 100.0 | 92.8 |
| Example 50 | 1.44 | 99.8 | 91.6 |
| Example 51 | 1.43 | 99.6 | 93.9 |
| Example 52 | 1.42 | 99.7 | 94.7 |
| Example 53 | 1.52 | 99.5 | 96.4 |
| Example 54 | 1.47 | 99.8 | 95.9 |
| Example 55 | 1.45 | 99.9 | 95.6 |
| Example 56 | 1.48 | 100.0 | 96.9 |
| Example 57 | 1.42 | 100.0 | 97.3 |
| Example 58 | 1.40 | 99.8 | 94.1 |
| Example 59 | 1.44 | 99.6 | 94.3 |
| Example 60 | 1.53 | 100.0 | 92.1 |
| Example 61 | 1.50 | 100.0 | 91.0 |
| Example 62 | 1.46 | 100.0 | 96.0 |
| Example 63 | 1.47 | 99.8 | 97.1 |
| Example 64 | 1.45 | 99.9 | 96.1 |
| Example 65 | 1.51 | 99.9 | 95.8 |
| Example 66 | 1.49 | 100.0 | 96.2 |
| Example 67 | 1.50 | 99.6 | 95.9 |
| Example 68 | 1.48 | 99.8 | 95.5 |
| Example 69 | 1.47 | 99.7 | 97.0 |
| Example 70 | 1.52 | 99.8 | 96.4 |
| Example 71 | 1.48 | 99.9 | 95.7 |
| Example 72 | 1.49 | 99.8 | 95.9 |
| Example 73 | 1.53 | 99.6 | 95.8 |
| Example 74 | 1.46 | 99.7 | 96.3 |
| Example 75 | 1.48 | 99.8 | 95.8 |
| Example 76 | 1.51 | 99.6 | 96.4 |
| Example 77 | 1.47 | 100.0 | 96.2 |
| Example 78 | 1.48 | 100.0 | 95.7 |
| Example 79 | 1.52 | 99.9 | 96.4 |

TABLE 5-continued

| | Average equivalent circular diameter [μm] | $D_{25}$ [%] | Relative density [%] |
|---|---|---|---|
| Example 80 | 1.50 | 99.9 | 97.0 |
| Example 113 | 1.40 | 99.8 | 97.5 |
| Example 114 | 1.51 | 99.8 | 97.3 |
| Example 115 | 1.53 | 99.9 | 97.4 |

TABLE 6

| | Main component | | | | | A/B a | First auxiliary component Mn b | a − b | Second auxiliary component | | | | Third auxiliary component |
|---|---|---|---|---|---|---|---|---|---|---|---|---|---|
| | Ba 1 − x | Ca x | Ti 1 − y − z | Sn y | Zr z | | | | Cu Parts by weight | Si Parts by weight | B Parts by weight | Total Parts by weight | |
| Example 48 | 0.920 | 0.080 | 0.960 | 0.040 | 0.000 | 1.0111 | 0.0121 | 0.999 | 0.0000 | 0.0140 | 0.0066 | 0.0206 | 0.000 |
| Example 49 | 0.860 | 0.140 | 0.960 | 0.040 | 0.000 | 1.0111 | 0.0121 | 0.999 | 0.0000 | 0.0140 | 0.0066 | 0.0206 | 0.000 |
| Example 50 | 0.800 | 0.200 | 0.960 | 0.040 | 0.000 | 1.0111 | 0.0121 | 0.999 | 0.0000 | 0.0140 | 0.0066 | 0.0206 | 0.000 |
| Example 51 | 0.910 | 0.090 | 0.965 | 0.035 | 0.000 | 1.0111 | 0.0121 | 0.999 | 0.0000 | 0.0140 | 0.0066 | 0.0206 | 0.000 |
| Example 52 | 0.810 | 0.190 | 0.965 | 0.035 | 0.000 | 1.0111 | 0.0121 | 0.999 | 0.0000 | 0.0140 | 0.0066 | 0.0206 | 0.000 |
| Example 53 | 0.900 | 0.100 | 0.970 | 0.035 | 0.000 | 1.0111 | 0.0121 | 0.999 | 0.0000 | 0.0140 | 0.0066 | 0.0206 | 0.000 |
| Example 54 | 0.880 | 0.120 | 0.970 | 0.030 | 0.000 | 1.0111 | 0.0121 | 0.999 | 0.0000 | 0.0140 | 0.0066 | 0.0206 | 0.000 |
| Example 55 | 0.850 | 0.150 | 0.970 | 0.030 | 0.000 | 1.0111 | 0.0121 | 0.999 | 0.0000 | 0.0140 | 0.0066 | 0.0206 | 0.000 |
| Example 56 | 0.900 | 0.100 | 0.980 | 0.020 | 0.000 | 1.0111 | 0.0121 | 0.999 | 0.0000 | 0.0140 | 0.0066 | 0.0206 | 0.000 |
| Example 57 | 0.850 | 0.150 | 0.980 | 0.020 | 0.000 | 1.0111 | 0.0121 | 0.999 | 0.0000 | 0.0140 | 0.0066 | 0.0206 | 0.000 |
| Example 58 | 0.910 | 0.090 | 0.985 | 0.015 | 0.000 | 1.0111 | 0.0121 | 0.999 | 0.0000 | 0.0140 | 0.0066 | 0.0206 | 0.000 |
| Example 59 | 0.810 | 0.190 | 0.985 | 0.015 | 0.000 | 1.0111 | 0.0121 | 0.999 | 0.0000 | 0.0140 | 0.0066 | 0.0206 | 0.000 |
| Example 60 | 0.920 | 0.080 | 0.990 | 0.010 | 0.000 | 1.0111 | 0.0121 | 0.999 | 0.0000 | 0.0140 | 0.0066 | 0.0206 | 0.000 |
| Example 61 | 0.800 | 0.200 | 0.990 | 0.010 | 0.000 | 1.0111 | 0.0121 | 0.999 | 0.0000 | 0.0140 | 0.0066 | 0.0206 | 0.000 |
| Example 62 | 0.880 | 0.120 | 0.940 | 0.030 | 0.030 | 1.0111 | 0.0121 | 0.999 | 0.0000 | 0.0140 | 0.0066 | 0.0206 | 0.000 |
| Example 63 | 0.880 | 0.120 | 0.930 | 0.030 | 0.040 | 1.0111 | 0.0121 | 0.999 | 0.0000 | 0.0140 | 0.0066 | 0.0206 | 0.000 |
| Example 64 | 0.880 | 0.120 | 0.970 | 0.030 | 0.000 | 1.0111 | 0.0121 | 0.999 | 0.0010 | 0.0000 | 0.0000 | 0.0010 | 0.000 |
| Example 65 | 0.880 | 0.120 | 0.970 | 0.030 | 0.000 | 1.0111 | 0.0121 | 0.999 | 4.0000 | 0.0000 | 0.0000 | 4.0000 | 0.000 |
| Example 66 | 0.880 | 0.120 | 0.970 | 0.030 | 0.000 | 1.0111 | 0.0121 | 0.999 | 0.0000 | 0.0010 | 0.0000 | 0.0010 | 0.000 |
| Example 67 | 0.880 | 0.120 | 0.970 | 0.030 | 0.000 | 1.0111 | 0.0121 | 0.999 | 0.0000 | 4.0000 | 0.0000 | 4.0000 | 0.000 |
| Example 68 | 0.880 | 0.120 | 0.970 | 0.030 | 0.000 | 1.0111 | 0.0121 | 0.999 | 0.0000 | 0.0000 | 0.0010 | 0.0010 | 0.000 |
| Example 69 | 0.880 | 0.120 | 0.970 | 0.030 | 0.000 | 1.0111 | 0.0121 | 0.999 | 0.0000 | 0.0000 | 4.0000 | 4.0000 | 0.000 |
| Example 70 | 0.880 | 0.120 | 0.970 | 0.030 | 0.000 | 1.0111 | 0.0121 | 0.999 | 0.0000 | 0.0005 | 0.0005 | 0.0010 | 0.000 |
| Example 71 | 0.880 | 0.120 | 0.970 | 0.030 | 0.000 | 1.0111 | 0.0121 | 0.999 | 0.0000 | 0.0100 | 0.0066 | 0.0166 | 0.000 |
| Example 72 | 0.880 | 0.120 | 0.970 | 0.030 | 0.000 | 1.0111 | 0.0121 | 0.999 | 0.0000 | 0.0250 | 0.0066 | 0.0316 | 0.000 |
| Example 73 | 0.880 | 0.120 | 0.970 | 0.030 | 0.000 | 1.0111 | 0.0121 | 0.999 | 0.0000 | 0.0300 | 0.0066 | 0.0366 | 0.000 |
| Example 74 | 0.880 | 0.120 | 0.970 | 0.030 | 0.000 | 1.0111 | 0.0121 | 0.999 | 0.0000 | 2.0000 | 2.0000 | 4.0000 | 0.000 |
| Example 75 | 0.880 | 0.120 | 0.970 | 0.030 | 0.000 | 1.0111 | 0.0121 | 0.999 | 0.0005 | 0.0005 | 0.0000 | 0.0010 | 0.000 |
| Example 76 | 0.880 | 0.120 | 0.970 | 0.030 | 0.000 | 1.0111 | 0.0121 | 0.999 | 2.0000 | 2.0000 | 0.0000 | 4.0000 | 0.000 |
| Example 77 | 0.880 | 0.120 | 0.970 | 0.030 | 0.000 | 1.0111 | 0.0121 | 0.999 | 0.0005 | 0.0000 | 0.0005 | 0.0010 | 0.000 |
| Example 78 | 0.880 | 0.120 | 0.970 | 0.030 | 0.000 | 1.0111 | 0.0121 | 0.999 | 2.0000 | 0.0000 | 2.0000 | 4.0000 | 0.000 |

TABLE 6-continued

| | Main component | | | | | A/B | First auxiliary component | | Second auxiliary component | | | | Third |
| | | | | | | | Mn | | Cu | Si | B | Total | auxiliary |
| | Ba 1 − x | Ca x | Ti 1 − y − z | Sn y | Zr z | a | b | a − b | Parts by weight | Parts by weight | Parts by weight | Parts by weight | component |
|---|---|---|---|---|---|---|---|---|---|---|---|---|---|
| Example 79 | 0.880 | 0.120 | 0.970 | 0.030 | 0.000 | 1.0111 | 0.0121 | 0.999 | 0.0034 | 0.0034 | 0.0034 | 0.0102 | 0.000 |
| Example 80 | 0.880 | 0.120 | 0.970 | 0.030 | 0.000 | 1.0111 | 0.0121 | 0.999 | 1.3000 | 1.3000 | 1.3000 | 3.9000 | 0.000 |
| Example 113 | 0.880 | 0.120 | 0.960 | 0.030 | 0.010 | 1.0111 | 0.0121 | 0.999 | 0.0000 | 0.0140 | 0.0066 | 0.0206 | 0.000 |
| Example 114 | 0.880 | 0.120 | 0.960 | 0.030 | 0.010 | 1.0111 | 0.0121 | 0.999 | 0.0034 | 0.0034 | 0.0034 | 0.0102 | 0.000 |
| Example 115 | 0.880 | 0.120 | 0.960 | 0.030 | 0.010 | 1.0111 | 0.0121 | 0.999 | 1.3000 | 1.3000 | 1.3000 | 3.9000 | 0.000 |

Examples 49 to 80 and Examples 113 to 115

Piezoelectric ceramics were manufactured at the ratios and the maximum temperature $T_{max}$ shown in Table 4 in the same manner as in Example 48. The raw material of Cu was copper (II) oxide. The average equivalent circular diameter, $D_{25}$, and the relative density were determined. Table 5 shows the results. The composition was determined in the same manner as in Example 1. Table 6 shows the results.

A piezoelectric element according to an example of the present invention was then manufactured.

Manufacture of Piezoelectric Element and Characterization

Examples 1 to 80 and Examples 100 to 115

Piezoelectric elements were manufactured using the piezoelectric ceramics according to Examples 1 to 80 and Examples 100 to 115.

A gold electrode having a thickness of 400 nm was formed on the front and back sides of the discoidal ceramic by DC sputtering. A titanium film having a thickness of 30 nm was formed as an adhesion layer between the electrode and the ceramic. The ceramic having the electrodes was cut into a 10 mm×2.5 mm×0.5 mm plate-like piezoelectric element.

A 1.4 kV/mm electric field was applied to the piezoelectric element on a hot plate at a temperature in the range of 60° C. to 150° C. for 30 minutes to perform polarization treatment.

The Curie temperature, the piezoelectric constant $d_{31}$, and the mechanical quality factor (Qm) of each of the piezoelectric elements manufactured using piezoelectric ceramics according to examples and comparative examples of the present invention were measured after polarization treatment. Table 7 shows the results. The "phase transition point" in the table indicates the presence of a phase transition point in the range of 0° C. to 90° C. "Yes" means the presence of a maximum dielectric constant in a very small alternating electric field at a frequency of 1 kHz at a measurement temperature from 0° C. to 90° C. "No" means the absence of the maximum dielectric constant. The Curie temperature was a temperature at which the dielectric constant reached its maximum in a very small alternating electric field at a frequency of 1 kHz. The piezoelectric constant $d_{31}$ was measured by a resonance-antiresonance method. Table 4 shows its absolute value. The mechanical quality factor Qm was measured by the resonance-antiresonance method.

Resistivity was measured as a measure of the insulation property. Resistivity was measured using a non-polarizing piezoelectric element. Twenty seconds after a 10 V direct current bias was applied between two electrodes of a piezoelectric element, the resistivity of the piezoelectric element was measured from the leakage current. Table 7 shows the results.

When the resistivity is $1 \times 10^9$ Ω·cm or more, preferably $100 \times 10^9$ Ω·cm or more, the piezoelectric ceramic and the piezoelectric element have a satisfactory practical insulation property.

TABLE 7

| | $|d_{31}|$ [pm/V] | Qm | Curie temperature [° C.] | Phase transition point | Resistivity [GΩ·cm] |
|---|---|---|---|---|---|
| Example 1 | 68.5 | 942 | 108 | No | 73 |
| Example 2 | 82.6 | 985 | 103 | No | 76 |
| Example 3 | 76.2 | 1025 | 103 | No | 71 |
| Example 4 | 69.1 | 979 | 103 | No | 72 |
| Example 5 | 81.4 | 1001 | 106 | No | 78 |
| Example 6 | 74.6 | 994 | 106 | No | 74 |
| Example 7 | 80.1 | 963 | 109 | No | 73 |
| Example 8 | 63.2 | 1096 | 108 | No | 72 |
| Example 9 | 73.5 | 971 | 112 | No | 73 |
| Example 10 | 60.2 | 1000 | 113 | No | 71 |
| Example 11 | 70.4 | 1083 | 116 | No | 74 |
| Example 12 | 60.3 | 1015 | 117 | No | 73 |
| Example 13 | 68.2 | 946 | 120 | No | 71 |
| Example 14 | 60.1 | 954 | 121 | No | 70 |
| Example 15 | 76.4 | 988 | 100 | No | 72 |
| Example 16 | 70.0 | 951 | 100 | No | 74 |
| Example 17 | 80.9 | 1057 | 102 | No | 76 |
| Example 18 | 76.2 | 981 | 102 | No | 75 |
| Example 19 | 79.9 | 1013 | 104 | No | 78 |
| Example 20 | 69.0 | 1011 | 104 | No | 71 |
| Example 21 | 63.2 | 1062 | 105 | No | 75 |
| Example 22 | 74.6 | 969 | 109 | No | 73 |
| Example 23 | 61.1 | 1126 | 110 | No | 72 |
| Example 24 | 70.2 | 968 | 113 | No | 77 |
| Example 25 | 79.9 | 1045 | 114 | No | 75 |
| Example 26 | 69.0 | 984 | 117 | No | 72 |
| Example 27 | 60.5 | 977 | 117 | No | 73 |
| Example 28 | 77.0 | 1007 | 95 | No | 74 |
| Example 29 | 69.0 | 983 | 96 | No | 76 |
| Example 30 | 82.0 | 996 | 100 | No | 72 |
| Example 31 | 74.8 | 1019 | 100 | No | 76 |
| Example 32 | 81.0 | 1159 | 102 | No | 71 |
| Example 33 | 68.7 | 944 | 102 | No | 72 |
| Example 34 | 63.3 | 983 | 103 | No | 70 |
| Example 35 | 74.0 | 1004 | 107 | No | 76 |
| Example 36 | 60.8 | 1007 | 108 | No | 73 |
| Example 37 | 71.3 | 1098 | 111 | No | 74 |
| Example 38 | 61.2 | 998 | 112 | No | 73 |
| Example 39 | 68.1 | 937 | 115 | No | 70 |
| Example 40 | 60.2 | 1100 | 115 | No | 77 |
| Example 41 | 60.1 | 1066 | 120 | No | 75 |
| Example 42 | 60.2 | 1007 | 119 | No | 74 |
| Example 43 | 79.8 | 986 | 121 | No | 70 |
| Example 44 | 68.4 | 983 | 107 | No | 73 |

TABLE 7-continued

| | |d31| [pm/V] | Qm | Curie temperature [° C.] | Phase transition point | Resistivity [GΩ·cm] |
|---|---|---|---|---|---|
| Example 45 | 68.3 | 1074 | 108 | No | 76 |
| Example 46 | 68.8 | 1111 | 108 | No | 77 |
| Example 47 | 69.0 | 1010 | 108 | No | 79 |
| Example 48 | 73.4 | 815 | 103 | No | 100 |
| Example 49 | 70.0 | 756 | 102 | No | 105 |
| Example 50 | 73.7 | 789 | 103 | No | 107 |
| Example 51 | 72.6 | 801 | 106 | No | 116 |
| Example 52 | 74.6 | 822 | 106 | No | 125 |
| Example 53 | 74.3 | 826 | 108 | No | 103 |
| Example 54 | 66.8 | 822 | 108 | No | 106 |
| Example 55 | 66.5 | 703 | 106 | No | 102 |
| Example 56 | 67.3 | 762 | 112 | No | 107 |
| Example 57 | 67.9 | 749 | 113 | No | 105 |
| Example 58 | 65.4 | 716 | 116 | No | 110 |
| Example 59 | 62.7 | 735 | 117 | No | 111 |
| Example 60 | 61.8 | 710 | 120 | No | 106 |
| Example 61 | 60.7 | 724 | 121 | No | 103 |
| Example 62 | 68.4 | 704 | 108 | No | 107 |
| Example 63 | 67.9 | 827 | 108 | No | 109 |
| Example 64 | 66.8 | 762 | 108 | No | 81 |
| Example 65 | 69.2 | 743 | 108 | No | 89 |
| Example 66 | 68.3 | 724 | 108 | No | 83 |
| Example 67 | 66.1 | 725 | 108 | No | 87 |
| Example 68 | 67.2 | 713 | 108 | No | 83 |
| Example 69 | 67.7 | 700 | 108 | No | 80 |
| Example 70 | 66.9 | 726 | 108 | No | 84 |
| Example 71 | 67.4 | 724 | 108 | No | 82 |
| Example 72 | 67.8 | 718 | 108 | No | 121 |
| Example 73 | 67.2 | 735 | 108 | No | 82 |
| Example 74 | 68.0 | 746 | 108 | No | 82 |
| Example 75 | 67.8 | 720 | 108 | No | 86 |
| Example 76 | 66.9 | 716 | 108 | No | 84 |
| Example 77 | 67.4 | 733 | 108 | No | 88 |
| Example 78 | 67.3 | 729 | 108 | No | 82 |
| Example 79 | 66.9 | 726 | 108 | No | 86 |
| Example 80 | 66.8 | 721 | 108 | No | 80 |
| Comparative example 1 | 72.3 | 598 | 76 | Yes | 68 |
| Comparative example 2 | 73.3 | 580 | 77 | Yes | 60 |
| Comparative example 3 | 62.8 | 719 | 100 | Yes | 55 |
| Comparative example 4 | 30.6 | 813 | 119 | No | 61 |
| Comparative example 5 | 34.2 | 792 | 126 | No | 59 |
| Comparative example 6 | 26.4 | 771 | 125 | No | 67 |
| Comparative example 7 | 74.9 | 764 | 70 | Yes | 66 |
| Comparative example 8 | 75.2 | 637 | 70 | Yes | 50 |
| Comparative example 9 | 63.7 | 702 | 91 | Yes | 68 |
| Comparative example 10 | 32.0 | 622 | 110 | No | 62 |
| Comparative example 11 | 37.6 | 743 | 114 | Yes | 54 |
| Comparative example 12 | 28.6 | 698 | 114 | No | 57 |
| Comparative example 13 | 77.1 | 551 | 61 | Yes | 63 |
| Comparative example 14 | 77.0 | 549 | 63 | Yes | 52 |
| Comparative example 15 | 66.2 | 638 | 89 | Yes | 69 |
| Comparative example 16 | 33.9 | 711 | 106 | No | 58 |
| Comparative example 17 | 38.8 | 801 | 111 | No | 59 |
| Comparative example 18 | 29.0 | 762 | 110 | No | 64 |
| Comparative example 19 | x | x | x | x | 0.8 |
| Comparative example 20 | 72.3 | 426 | 107 | No | 67 |
| Comparative example 21 | x | x | x | x | 0.9 |
| Comparative example 22 | 70.0 | 236 | 108 | No | 69 |
| Comparative example 23 | x | x | x | x | 0.9 |
| Example 100 | 76.0 | 990 | 102 | No | 73 |
| Example 101 | 70.3 | 971 | 102 | No | 72 |
| Example 102 | 89.6 | 1044 | 102 | No | 75 |
| Example 103 | 76.1 | 990 | 102 | No | 75 |
| Example 104 | 79.9 | 1011 | 106 | No | 79 |
| Example 105 | 69.1 | 1025 | 106 | No | 72 |
| Example 106 | 63.1 | 1051 | 107 | No | 77 |
| Example 107 | 75.0 | 993 | 110 | No | 72 |
| Example 108 | 61.6 | 1106 | 112 | No | 72 |
| Example 109 | 70.7 | 998 | 114 | No | 76 |
| Example 110 | 80.1 | 1022 | 115 | No | 77 |
| Example 111 | 69.3 | 980 | 118 | No | 71 |
| Example 112 | 60.8 | 955 | 119 | No | 76 |
| Example 113 | 69.1 | 722 | 109 | No | 111 |
| Example 114 | 67.0 | 720 | 108 | No | 85 |
| Example 115 | 66.9 | 726 | 108 | No | 79 |
| Comparative Example 100 | 75.3 | 770 | 72 | Yes | 69 |
| Comparative Example 101 | 75.1 | 634 | 68 | Yes | 48 |
| Comparative Example 102 | 64.2 | 709 | 90 | Yes | 69 |
| Comparative Example 103 | 31.8 | 618 | 108 | No | 58 |
| Comparative Example 104 | 37.9 | 737 | 111 | Yes | 56 |
| Comparative Example 105 | 28.0 | 701 | 112 | No | 54 |

In all the examples, even when the electrodes were made of baked silver paste, the same characteristics as in the case of the gold electrode were obtained.

Comparative Examples 1 to 23 and Comparative Examples 100 to 105

Piezoelectric elements were manufactured using the comparative ceramics according to Comparative Examples 1 to 23 and Comparative Examples 100 to 105 in the same manner as in Examples 1 to 80 and Examples 100 to 115.

The piezoelectric elements were evaluated in the same manner as in Examples 1 to 80 and Examples 100 to 115. Table 7 shows the results. The cross mark in the table indicates that resistivity was too low to measure.

A comparison of Comparative Examples 1, 2, 7, 8, 13, 14, 100, and 101 with Examples 1 to 80 and Examples 100 to 115 shows that y of more than 0.04 unacceptably results in a Curie temperature much lower than 100° C., more specifically, 80° C. or less.

A comparison of the characteristics of the elements described in Comparative Examples 3, 9, 15, and 102 and Examples 1 to 80 and Examples 100 to 115 shows that x of less than 0.08 unacceptably results in a phase transition point in the range of 0° C. to 90° C. and low durability of the piezoelectric element.

A comparison of Comparative Examples 4, 10, 16, and 103 with Examples 1 to 80 and Examples 100 to 115 shows that x of more than 0.20 unacceptably results in $d_{31}$ much lower than 50 [pm/V].

A comparison of Comparative Examples 5, 6, 11, 12, 17, 18, 104, and 105 with Examples 1 to 80 and Examples 100 to 115 shows that y of less than 0.01 unacceptably results in $d_{31}$ much lower than 50 [pm/V].

A comparison of Comparative Example 19 with Examples 1 to 80 and Examples 100 to 115 shows that z of more than 0.04 results in a high sintering temperature and a low relative density. This disadvantageously reduces resistivity and makes polarization impossible.

A comparison of Comparative Example 20 with Examples 1 to 80 and Examples 100 to 115 shows that a value a of less than 0.9925+b results in abnormal grain growth and an average equivalent circular diameter of much more than 10 µm, disadvantageously resulting in a markedly reduced mechanical strength.

A comparison of Comparative Example 21 with Examples 1 to 80 and Examples 100 to 115 shows that a value a of more than 1.0025+b results in suppressed grain growth and a low relative density. This disadvantageously reduces resistivity and makes polarization impossible.

A comparison of Comparative Example 22 with Examples 1 to 80 and Examples 100 to 115 shows that a value b of less than 0.0048 unacceptably results in Qm of much less than 400 and markedly reduced driving efficiency.

A comparison of Comparative Example 23 and Examples 1 to 80 and Examples 100 to 115 shows that a value b of more than 0.0400 results in markedly reduced resistivity. This disadvantageously makes polarization impossible. This is probably because of the occurrence of a heterophase that does not contribute to the piezoelectric property.

A comparison of Examples 1 to 47 and Examples 100 to 112 and Examples 48 to 80 and Examples 113 to 115 shows that Examples 48 to 80 and Examples 113 to 115 containing the second auxiliary component advantageously have a resistivity of $80 \times 10^9$ Ω·cm or more. It also shows that the firing temperature is more advantageously 1200° C.

Comparing Examples 48 to 63, 72, and 113 with Examples 64 to 71, 73 to 80, 114, and 115, when the weight ratio G1/G2 of the weight G1 of Si to the weight G2 of B of the second auxiliary component is in the range of 2.0≤G1/G2≤3.8, the resistivity is more advantageously $100 \times 10^9$ Ω·cm or more.

A comparison of Examples 1 to 14 and 44 to 47 with Examples 15 to 43 and 100 to 112 shows that z=0 more advantageously results in a decrease in the maximum sintering temperature by 50° C. This is probably because z=0 results in a high grain growth rate.

Evaluation of Durability of Piezoelectric Element

In order to examine the durability of a piezoelectric element, Examples 1 to 14, 20, 33, 54, 62, 63, 105, and 113, Comparative Examples 1, 3, 7, 9, 11, 13, 15, 100, 102, and 104 were subjected to a cycle test in a thermostat. A hundred of temperature cycles of 25° C.→0° C.→50° C.→25° C. were performed. Table 8 shows the rate of change in piezoelectric constant $d_{31}$ in the cycle test.

TABLE 8

| | Phase transition point | Piezoelectric constant $|d_{31}|$ before cycle test [pm/V] | Piezoelectric constant $|d_{31}|$ after cycle test [pm/V] | Variation ratio [%] |
|---|---|---|---|---|
| Example 1 | No | 68.5 | 66.5 | −2.9 |
| Example 2 | No | 82.6 | 79.5 | −3.8 |
| Example 3 | No | 76.2 | 74.5 | −2.2 |
| Example 4 | No | 69.1 | 66.4 | −3.9 |
| Example 5 | No | 81.4 | 78.0 | −4.2 |
| Example 6 | No | 74.6 | 71.5 | −4.1 |
| Example 7 | No | 80.1 | 76.9 | −4.0 |
| Example 8 | No | 63.2 | 60.9 | −3.6 |
| Example 9 | No | 73.5 | 70.8 | −3.7 |
| Example 10 | No | 60.2 | 57.5 | −4.5 |
| Example 11 | No | 70.4 | 67.3 | −4.4 |

TABLE 8-continued

| | Phase transition point | Piezoelectric constant $|d_{31}|$ before cycle test [pm/V] | Piezoelectric constant $|d_{31}|$ after cycle test [pm/V] | Variation ratio [%] |
|---|---|---|---|---|
| Example 12 | No | 60.3 | 58.1 | −3.6 |
| Example 13 | No | 68.2 | 65.7 | −3.7 |
| Example 14 | No | 60.1 | 58.1 | −3.4 |
| Example 20 | No | 69.0 | 66.2 | −4.1 |
| Example 33 | No | 68.7 | 65.5 | −4.6 |
| Example 54 | No | 66.8 | 63.6 | −4.9 |
| Example 62 | No | 68.4 | 65.9 | −3.7 |
| Example 63 | No | 67.9 | 65.7 | −3.3 |
| Comparative example 1 | Yes | 72.3 | 55.4 | −23.4 |
| Comparative example 3 | Yes | 62.8 | 45.5 | −27.6 |
| Comparative example 7 | Yes | 74.9 | 58.1 | −22.4 |
| Comparative example 9 | Yes | 63.7 | 47.9 | −24.8 |
| Comparative example 11 | Yes | 37.6 | 29.9 | −20.6 |
| Comparative example 13 | Yes | 77.1 | 59.4 | −23.0 |
| Comparative example 15 | Yes | 66.2 | 51.0 | −22.9 |
| Example 105 | No | 70.2 | 67.1 | −4.4 |
| Example 113 | No | 69.1 | 66.9 | −3.2 |
| Comparative Example 100 | Yes | 75.1 | 55.5 | −26.1 |
| Comparative Example 102 | Yes | 62.5 | 46.9 | −25.0 |
| Comparative Example 104 | Yes | 38.2 | 29.5 | −22.8 |

Comparative Examples 1, 3, 7, 9, 11, 13, 15, 100, 102, and 104 have a variation ratio of much more than −10% and has lower durability than Examples 1 to 14, 20, 33, 54, 62, 63, 105, and 113. Thus, Comparative Examples 1, 3, 7, 9, 11, 13, 15, 100, 102, and 104 are unfavorable.

A multilayered piezoelectric element according to an example of the present invention was manufactured.

Multilayered Piezoelectric Element

Example 81

A composition $(Ba_{0.880}Ca_{0.120})_{1.0111}(Ti_{0.970}Sn_{0.030})O_3$ was weighed as described below. This composition is represented by the general formula $(Ba_{1-x}Ca_x)_a(Ti_{1-y-z}Sn_yZr_z)O_3$, wherein x=0.120, y=0.030, z=0, and a=1.0111.

Barium carbonate, calcium carbonate, titanium oxide, and tin oxide were weighed as the raw materials of the main component such that Ba, Ca, Ti, and Sn satisfied the composition $(Ba_{0.880}Ca_{0.120})_{1.0111}(Ti_{0.970}Sn_{0.030})O_3$.

Manganese dioxide was weighed such that the b mol of the first auxiliary component Mn was 0.0121 mol per mole of the composition $(Ba_{0.880}Ca_{0.120})_{1.0111}(Ti_{0.970}Sn_{0.030})O_3$.

Silicon dioxide and boron trioxide were weighed such that the second auxiliary components Si and B were 0.0140 parts by weight and 0.0066 parts by weight on a metal basis, respectively, per 100 parts by weight of the composition $(Ba_{0.880}Ca_{0.120})_{1.0111}(Ti_{0.970}Sn_{0.030})O_3$.

The weighed powders were mixed with PVB and were formed into a green sheet having a thickness of 50 µm by a doctor blade method.

An electroconductive paste for an internal electrode was applied to the green sheet. The electroconductive paste was a 70% Ag-30% Pd alloy (Ag/Pd=2.33) paste. Nine green sheets to which the electroconductive paste had been applied were stacked and were fired at 1200° C. for 5 hours to yield a sintered body. The sintered body was cut into a 10 mm×2.5 mm piece. The side surface of the piece was polished. A pair of external electrodes (a first electrode and a second electrode) for alternately connecting internal electrodes were formed by Au sputtering. Thus, a multilayered piezoelectric element as illustrated in FIG. 2B was manufactured.

The observation of the internal electrodes of the multilayered piezoelectric element showed that the electrode material Ag—Pd and piezoelectric ceramics were alternately stacked on top of one another.

Before the evaluation of piezoelectricity, a sample was subjected to polarization treatment. More specifically, the sample was heated to a temperature in the range of 100° C. to 150° C. on a hot plate. While a voltage of 1.4 kV/mm was applied between the first electrode and the second electrode for 30 minutes, the sample was cooled to room temperature.

The evaluation of the piezoelectricity of the multilayered piezoelectric element showed that the multilayered piezoelectric element had satisfactory insulation property and had satisfactory piezoelectric property similar to the piezoelectric ceramic according to Example 1.

Example 82

A multilayered piezoelectric element was manufactured in the same manner as in Example 81 except that barium titanate, calcium titanate, and barium stannate were used as raw materials for the main component. The value a representing the ratio of the number of moles of Ba and Ca at the A site to the number of moles of Ti and Sn at the B site was controlled with barium oxalate and calcium oxalate.

The evaluation of the piezoelectricity of the multilayered piezoelectric element showed that the multilayered piezoelectric element had satisfactory insulation property and better piezoelectric property than Example 81 by 5% or more. This is probably because the raw materials were perovskite type metal oxides, which promoted grain growth, resulting in the dense multilayered piezoelectric element.

Comparative Example 24

A multilayered piezoelectric element was manufactured in the same manner as in Example 81 except that the composition was the same as in Comparative Example 19, the firing temperature was 1300° C., and the internal electrodes were made of a 95% Ag-5% Pd alloy (Ag/Pd=19).

The internal electrodes were observed with a scanning electron microscope. The observation showed that the internal electrodes were melted and interspersed as islands. Thus, the internal electrodes were not conductive, and the multilayered piezoelectric element was not polarized. Thus, the piezoelectric constant could not be measured.

Comparative Example 25

A multilayered piezoelectric element was manufactured in the same manner as in Comparative Example 24 except that the internal electrodes were made of a 5% Ag-95% Pd alloy (Ag/Pd=0.05).

The internal electrodes were observed with a scanning electron microscope. The observation showed that sintering of the electrode material Ag—Pd was insufficient. Thus, the internal electrodes were not conductive, and the multilayered piezoelectric element was not polarized. Thus, the piezoelectric constant could not be measured.

Comparative Example 26

A multilayered piezoelectric element was manufactured in the same manner as in Comparative Example 24 except that the internal electrodes were made of a 70% Ag-30% Pd alloy (Ag/Pd=2.33).

The internal electrodes were observed with a scanning electron microscope. Although the electrode material Ag—Pd and piezoelectric ceramics were alternately stacked on top of one another, resistivity between a pair of external electrodes of the multilayered piezoelectric element was as low as $1 \times 10^8$ Ω·cm or less because of insufficient sintering of the piezoelectric ceramics. Thus, the multilayered piezoelectric element was not polarized, and the piezoelectric constant could not be measured.

Example 83

A liquid discharge head illustrated in FIGS. 3A and 3B was manufactured using the piezoelectric element according to Example 1. An ink was discharged in response to the input of an electric signal.

Example 84

A liquid discharge apparatus illustrated in FIG. 4 was manufactured using the liquid discharge head according to Example 83. An ink was discharged onto a recording medium in response to the input of an electric signal.

Example 85

An ultrasonic motor illustrated in FIG. 6A was manufactured using the piezoelectric element according to Example 1. Upon the application of an alternating voltage, the motor rotated.

Example 86

An optical apparatus illustrated in FIGS. 7A and 7B was manufactured using the ultrasonic motor according to Example 85. Upon the application of an alternating voltage, automatic focusing was observed.

Example 87

A dust removing device illustrated in FIGS. 9A and 9B was manufactured using the piezoelectric element according to Example 1. Upon the application of an alternating voltage after plastic beads were scattered, satisfactory dust removing efficiency was observed.

Example 88

An image pickup apparatus illustrated in FIG. 12 was manufactured using the dust removing device according to Example 87. Dust on a surface of an image pickup unit was satisfactorily removed, and images free of dust defects were obtained.

Example 89

Electronic equipment illustrated in FIG. 14 was manufactured using the piezoelectric element according to Example 1. Upon the application of an alternating voltage, a loudspeaker operated.

Example 90

A liquid discharge head illustrated in FIGS. 3A and 3B was manufactured using the multilayered piezoelectric element according to Example 81. An ink was discharged in response to the input of an electric signal.

Example 91

A liquid discharge apparatus illustrated in FIG. 4 was manufactured using the liquid discharge head according to Example 90. An ink was discharged onto a recording medium in response to the input of an electric signal.

Example 92

An ultrasonic motor illustrated in FIG. 6B was manufactured using the multilayered piezoelectric element according to Example 81. Upon the application of an alternating voltage, the motor rotated.

Example 93

An optical apparatus illustrated in FIGS. 7A and 7B was manufactured using the ultrasonic motor according to Example 92. Upon the application of an alternating voltage, automatic focusing was observed.

Example 94

A dust removing device illustrated in FIGS. 9A and 9B was manufactured using the multilayered piezoelectric element according to Example 81. Upon the application of an alternating voltage after plastic beads were scattered, satisfactory dust removing efficiency was observed.

Example 95

An image pickup apparatus illustrated in FIG. 12 was manufactured using the dust removing device according to Example 94. Dust on a surface of an image pickup unit was satisfactorily removed, and images free of dust defects were obtained.

Example 96

Electronic equipment illustrated in FIG. 14 was manufactured using the multilayered piezoelectric element according to Example 81. Upon the application of an alternating voltage, a loudspeaker operated.

A piezoelectric ceramic according to an embodiment of the present invention has a high and stable piezoelectric constant and a high and stable mechanical quality factor in a wide operating temperature range. The piezoelectric ceramic contains no lead and can reduce the load on the environment. Thus, the piezoelectric ceramic can be used without problems for apparatuses manufactured using a large amount of piezoelectric ceramic, such as liquid discharge heads, liquid discharge apparatuses, ultrasonic motors, optical apparatuses, vibratory apparatuses, dust removing devices, image pickup apparatuses, and electronic equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-098679 filed Apr. 24, 2012, which is hereby incorporated by reference herein in its entirety.

What is claimed is:

1. A piezoelectric ceramic, comprising: a main component containing a perovskite type metal oxide having the following general formula (1) or (2); and Mn as a first auxiliary component, $$(Ba_{1-x}Ca_x)_a(Ti_{1-y-z}Sn_yZr_z)O_3 \quad (1)$$

$(0.08 \le x \le 0.20, 0.01 \le y \le 0.04, 0 < z \le 0.04)$ $$(Ba_{1-x}Ca_x)_a(Ti_{1-y}Sn_y)O_3 \quad (2)$$

$(0.08 \le x \le 0.20, 0.01 \le y \le 0.04)$ wherein the amount b (mol) of Mn per mole of the metal oxide is in the range of $0.0048 \le b \le 0.0400$, and the value a of the general formula (1) or (2) is in the range of $0.9925+b \le a \le 1.0025+b$.

2. The piezoelectric ceramic according to claim 1, wherein the value z of the general formula (1) is zero.

3. The piezoelectric ceramic according to claim 1, further comprising a second auxiliary component containing at least one selected from the group consisting of Cu, B, and Si, wherein the second auxiliary component content on a metal basis is 0.001 parts by weight or more and 4.000 parts by weight or less per 100 parts by weight of the metal oxide.

4. The piezoelectric ceramic according to claim 1, wherein the average equivalent circular diameter of a plurality of crystal grains of the piezoelectric ceramic is 1 μm or more and 10 μm or less, and crystal grains having an equivalent circular diameter of 25 μm or less constitute 99 percent by number or more of the total crystal grains.

5. The piezoelectric ceramic according to claim 1, wherein the piezoelectric ceramic has a relative density of 90% or more and 100% or less.

6. A method for manufacturing the piezoelectric ceramic according to claim 1, comprising: sintering a compact containing at least Ba, Ca, Ti, Sn, and Mn at a temperature of 1200° C. or less.

7. A piezoelectric element, comprising: a first electrode; a piezoelectric ceramic; and a second electrode, wherein the piezoelectric ceramic is the piezoelectric ceramic according to claim 1.

8. A liquid discharge head, comprising: a liquid chamber; and
a discharge port in communication with the liquid chamber, wherein the liquid chamber has a vibrating unit that includes the piezoelectric element according to claim 7.

9. A liquid discharge apparatus, comprising: a recording medium conveying unit; and the liquid discharge head according to claim 8.

10. An ultrasonic motor, comprising: a vibrating member that includes the piezoelectric element according to claim 7; and a moving body in contact with the vibrating member.

11. A vibratory apparatus, comprising a vibrating member that includes the piezoelectric element according to claim 7.

12. A dust removing device, comprising the vibratory apparatus according to claim 11 in a vibrating unit.

13. An image pickup apparatus, comprising: the dust removing device according to claim 12 and an image pickup element unit, wherein the dust removing device includes a vibrating member on the light-receiving surface of the image pickup element unit.

14. Electronic equipment, comprising a piezoelectric acoustic component that includes the piezoelectric element according to claim 7.

15. A multilayered piezoelectric element, comprising: piezoelectric ceramic layers and electrode layers alternately stacked on top of one another, the electrode layers including an internal electrode, wherein the piezoelectric ceramic layers are formed of the piezoelectric ceramic according to claim 1.

16. The multilayered piezoelectric element according to claim 15, wherein the internal electrode contains Ag and Pd, and the weight ratio M1/M2 of the weight M1 of Ag to the weight M2 of Pd is in the range of $0.25 \leq M1/M2 \leq 4.0$.

17. The multilayered piezoelectric element according to claim 15, wherein the internal electrode contains at least one of Ni and Cu.

18. A method for manufacturing the multilayered piezoelectric element according to claim 15, comprising: (A) dispersing a metallic compound containing at least Ba, Ca, Ti, Sn, and Mn to produce a slurry; (B) forming a compact from the slurry; (C) forming an electrode on the compact; and (D) sintering a plurality of the compacts at a temperature of 1200° C. or less to manufacture the multilayered piezoelectric element.

19. The method for manufacturing the multilayered piezoelectric element according to claim 18, wherein the slurry contains a perovskite type metal oxide containing at least one of Ba and Ca and at least one of Ti and Sn.

\* \* \* \* \*